(12) United States Patent
Ward et al.

(10) Patent No.: US 10,754,092 B1
(45) Date of Patent: Aug. 25, 2020

(54) MEMS-DRIVEN OPTICAL PACKAGE WITH MICRO-LED ARRAY

(71) Applicants: Matthew E. Ward, Philadelphia, PA (US); Jeremy Hochman, Walnut, CA (US)

(72) Inventors: Matthew E. Ward, Philadelphia, PA (US); Jeremy Hochman, Walnut, CA (US)

(*) Notice: Subject to any disclaimer, the term of this patent is extended or adjusted under 35 U.S.C. 154(b) by 0 days.

(21) Appl. No.: 16/451,099

(22) Filed: Jun. 25, 2019

Related U.S. Application Data

(63) Continuation of application No. PCT/US2019/037598, filed on Jun. 18, 2019.

(60) Provisional application No. 62/821,256, filed on Mar. 20, 2019.

(51) Int. Cl.
| | | |
|---|---|---|
| *G02B 26/08* | (2006.01) | |
| *G02B 6/12* | (2006.01) | |
| *H01L 27/15* | (2006.01) | |
| *B81B 3/00* | (2006.01) | |

(52) U.S. Cl.
CPC ........ *G02B 6/12007* (2013.01); *B81B 3/0083* (2013.01); *H01L 27/156* (2013.01); *B81B 2203/0136* (2013.01); *G02B 2006/12102* (2013.01); *G02B 2006/12109* (2013.01); *G02B 2006/12164* (2013.01)

(58) Field of Classification Search
CPC .......... F21V 19/02; F21V 14/02; F21V 21/30; F21V 14/025; F21W 2131/406; F21Y 2115/10; F21Y 2113/00; F21Y 2107/70; G01J 1/04; G01J 1/0242; G01J 1/0403; G01J 1/0411; G01J 2005/106; G02B 2027/0109; G02B 2027/0174; G02B 3/0006; G02B 7/02; G02B 26/08; G02B 26/10; G02B 26/12; G03B 35/00; G09F 19/18; G03H 1/0011; G03H 1/20; G03H 2001/226; G03H 2210/30; H05B 33/0803
See application file for complete search history.

(56) References Cited

U.S. PATENT DOCUMENTS

| | | | | |
|---|---|---|---|---|
| 4,575,207 A | * | 3/1986 | August | G03B 35/00 396/324 |
| 4,671,632 A | * | 6/1987 | August | G03B 35/00 352/58 |
| 5,752,766 A | * | 5/1998 | Bailey | F21V 19/02 362/231 |
| 6,357,893 B1 | * | 3/2002 | Belliveau | F21L 4/027 362/285 |
| 8,449,148 B2 | | 5/2013 | Ikeda | |
| 9,955,144 B2 | | 4/2018 | Brown | |
| 2002/0008868 A1 | * | 1/2002 | Kubota | G01J 1/04 356/121 |

(Continued)

FOREIGN PATENT DOCUMENTS

WO     2013162977 A1    10/2013

*Primary Examiner* — William R Alexander
*Assistant Examiner* — Balram T Parbadia
(74) *Attorney, Agent, or Firm* — Schott, P.C.

(57) ABSTRACT

An optical light package includes an optical output lens, an optical filter located thereunder and between the output lens and LEDS, a tray of LEDs arrayed on a stage mounted on a linear comb based MEMS device that is distributed in such a way that the stage is movable, and a driver that controls movement of the stage.

15 Claims, 29 Drawing Sheets

(56) References Cited

U.S. PATENT DOCUMENTS

| | | | |
|---|---|---|---|
| 2002/0136010 A1* | 9/2002 | Luk | F21V 19/02 362/249.02 |
| 2005/0265024 A1* | 12/2005 | Luk | F21S 10/02 362/231 |
| 2007/0058034 A1* | 3/2007 | Numazaki | H04N 13/305 348/51 |
| 2008/0049315 A1* | 2/2008 | Morikuni | G03B 21/62 359/457 |
| 2008/0192231 A1* | 8/2008 | Jureller | G02B 21/008 356/36 |
| 2008/0239419 A1* | 10/2008 | Tachibana | G02B 5/32 359/11 |
| 2009/0027566 A1* | 1/2009 | Wargon | G06F 1/163 348/739 |
| 2009/0033604 A1* | 2/2009 | Silzars | G09G 3/30 345/84 |
| 2010/0290099 A1* | 11/2010 | Padiyar | G03H 1/0402 359/26 |
| 2012/0162996 A1* | 6/2012 | Ikeda | G03B 21/14 362/311.02 |
| 2013/0207964 A1 | 8/2013 | Fleck et al. | |
| 2013/0285885 A1* | 10/2013 | Nowatzyk | G02B 3/0006 345/8 |
| 2014/0267896 A1* | 9/2014 | Cox | G09F 9/3026 348/383 |
| 2015/0276490 A1* | 10/2015 | Shikii | G01J 5/0806 250/349 |
| 2016/0077338 A1* | 3/2016 | Robbins | G02B 27/0172 345/8 |

* cited by examiner

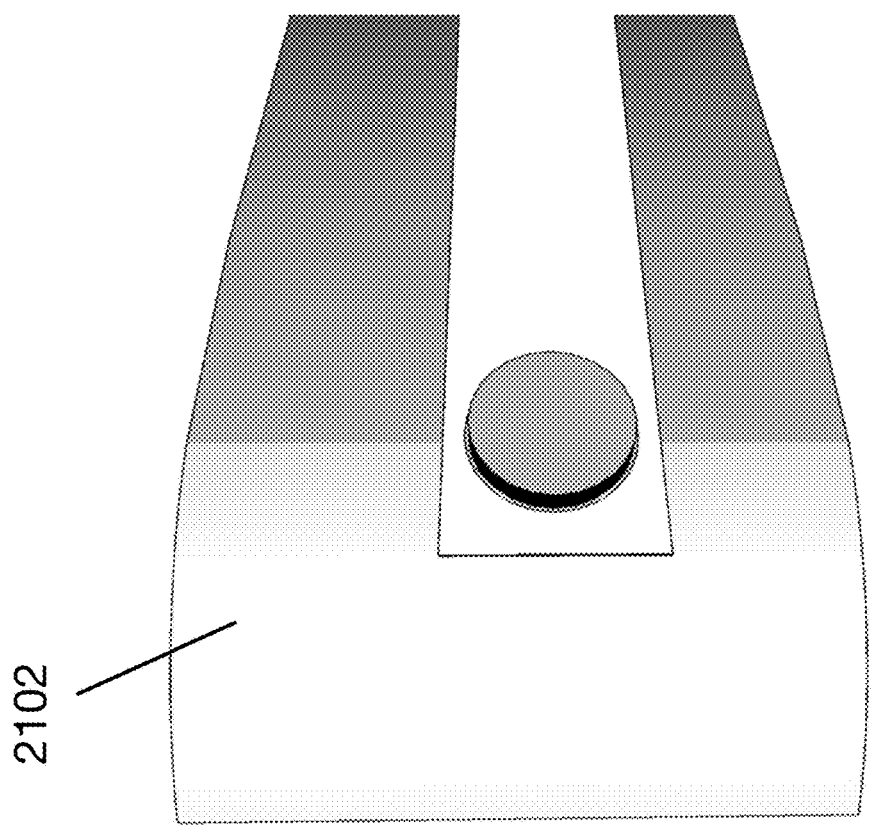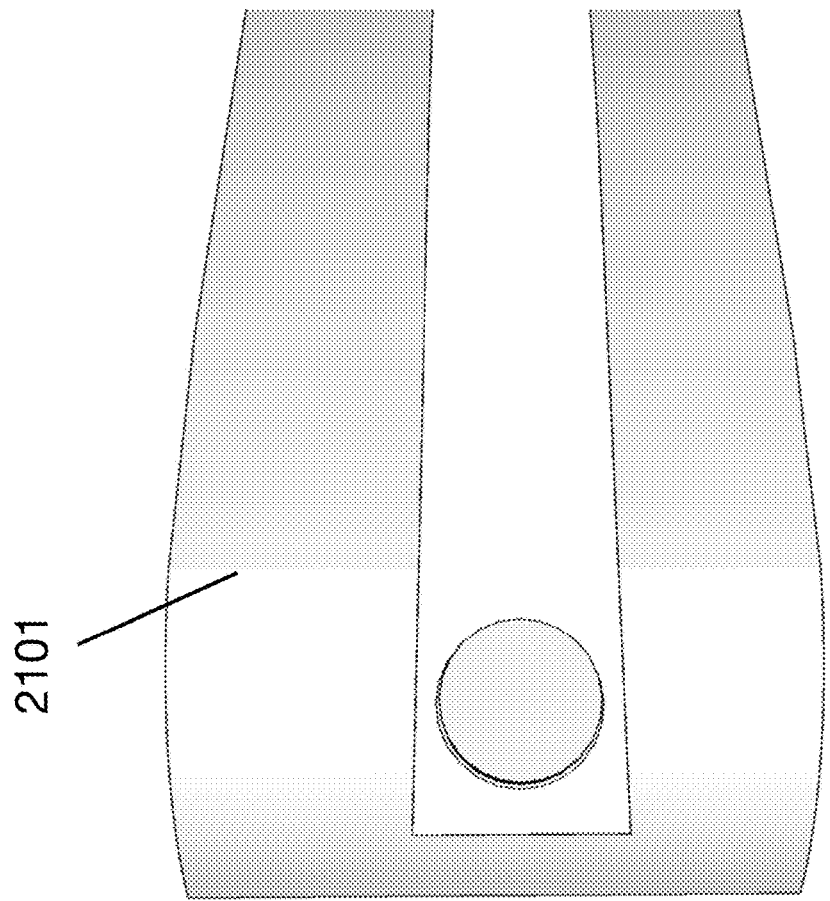
FIG. 24

MEMS-DRIVEN OPTICAL PACKAGE WITH MICRO-LED ARRAY

BACKGROUND

Any current vision of the future of immersive experience revolves around ambient imagery, ephemeral indicators, on-demand content built on a technology stack that includes a light-field-based system of pixels. For a menu to float off a wall or a billboard to float off the side of a building, the imagery must accommodate viewers from different angles. To make a holodeck or deliver on some other architecture of light, the user must have a display system that delivers content perceived as 3D and that provides real parallax, vergence, and accommodation to viewers across a range of different positions relative to the display. The system must do this regardless of whether that viewer wears glasses. The system must do this from any arbitrary point in the room without barrel rotation, a fault that causes each viewer to perceive an object in a slightly different location because of limits within legacy 3D systems.

There is no current screen that effectively manages light field display across an arbitrary surface in a way that is commercially scalable and that delivers effective extinction or ghosting of other viewing angles.

LCD derivatives used for small displays and displays are currently in the market and they use parallax barrier systems to deliver multiple angles of light with projected or direct view sources.

The Philips® 3D LCD system handles this by dicing the screen area up with a lenticular lens that divided the surface of the LCD into a defined number of slices so that a viewer could see a 3D image from a specific set of points of view but there was little opportunity for a shared experience without eye tracking and the experience will always be limited by the need to slice up the image area in vertical slices.

The Leia® display shares some characteristics with the display that Nintendo® delivered in the Nintendo 3DS®. The displays are optimized around a single user with a display right and left eye.

There are a variety of large modules being considered and there are complicated parallax barrier systems that treat existing displays in a manner that is not dissimilar to the Philips 3D system.

These monolithic systems will all have trouble scaling into room scale immersive environments. These systems also often have bezels that will figure in any final product marring the finished displays with seams that must be managed or tolerated. They are targeted at individual viewers and the market for smartphones is massive so this makes sense commercially.

But that means that none of these systems lends itself to use in large public display applications where a flexible modular approach will be required to jump start applications and to take advantage of existing mechanical systems.

One solution is to model the components on LED systems that have adopted the PLCC SMD package to allow for a wide variety of products. But there is an issue with using a large array of LEDs where the viewer is only intended to view a specific set of sub-pixels at a given time based on their location relative to the screen.

First, the relative surface area of each sub-pixel relative to the complete component would yield a very small active area. The light emitting elements in a 2 mm pixel pitch screen in the current LED market may be less than a few percentage points of the total surface area of a pixel. In a light field display packing hundreds of pixels into the same space the output power of that pixel required to maintain perceived screen brightness would jump substantially, and in some ways, unhelpfully.

Second, a mask is required to control the light output so that each viewer only sees the light field sub-pixel intended for them. This mask would create pixels with substantial off axis viewing issues and would likely create visual artifacts due to the incomplete extinction of neighboring light field sub-pixels.

Third, the duty cycle for each light field sub-pixel is small relative to the overall number of LED packages It would be possible to use multiplexing to use ⅓ the LED dies simplifying layout and reducing cost. It is also possible to use ⅕ or ⅛ the LED material depending on the goals of the system.

There are more problems, but the number of dies and the extinction issue are key. If a user cannot see just the image intended for them but also sees ghosting from the images intended for other people (the extinction ratio) then the technology will not succeed.

SUMMARY OF THE EMBODIMENTS

The proposed solution may use a number of LEDs that is ⅓ to ¼ of the total light field sub-pixel space and effectively manage the output of the LEDs such that each light field sub-pixel is only visible from a desired angle by moving a platform upon which the LEDs are mounted, and movement of the platform in this way uses a system/method called optical multiplexing herein.

Optical multiplexing uses a smaller amount of LEDs but also controls the distribution of light in a manner driven through processing based on the content. Such a system could increase the refresh rate of movement in a scene or increase the color space where there is low color contrast and it would be possible to extend color possibilities by using additional LEDs at different wavelengths.

A large light field system could be used on camera in a movie production to show dimensional computer graphics elements to an actor while the actor is filmed against a green screen background. In fact, the image could be created so that only cameras see the green screen through camera tracking and integration with the media server.

And smaller versions of the technology could find their ways into indicators in houses and elevators and automobiles. In fact, indication from automobiles will clearly become much more critical as autonomous vehicles start to take the roads.

BRIEF DESCRIPTION OF THE DRAWINGS

FIG. 24 shows an application in the automotive field showing two points of view.

DETAILED DESCRIPTION OF THE EMBODIMENTS

Hardware Considerations

Figure 1:
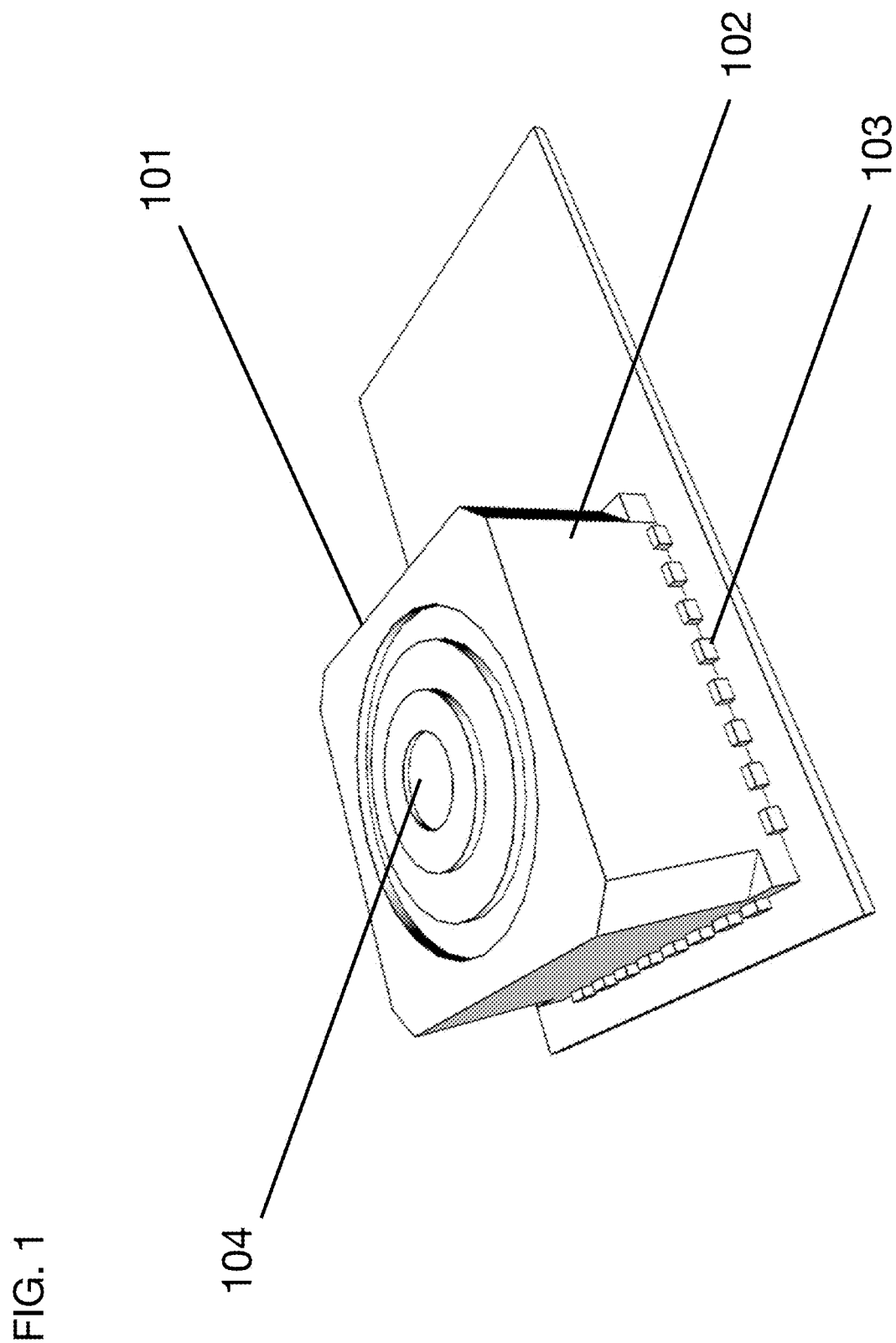
FIG. 1 shows a smartphone camera module.

Displays include packages comprising pixels that are made up of LEDs, as presented herein. The proposed application discussed herein uses a moving array/table/stage of alternately activatable LEDs, with each LED visible to different viewers, to create 3D images using a method called optical multiplexing.

The modular nature of the package component provides a precise image generation tool that can be used to provide a range of features and functionality from the consumption of entertainment to the creation of content in virtual sets to the physical world where the system can communicate to a pedestrian what an autonomous vehicle is about to do in a manner that is both clear and not invasive.

The modular nature of the system allows for the creation of these varied applications across a range of forms while integrating with existing surface mount production and PCB topologies.

A driver system may drive the video in a typical manner for an array of light emitting diodes while at the same time controlling the movement of the Micro-Electromechanical Systems (MEMS) system so that the position of the MEMS stage and the pattern of LED dies and the illumination of the light field LEDs is synchronized with the output of the video content. This can be thought of as a pattern move—blink—move—blink—move—blink—repeat.

The driver system may also require calibration to adjust for tolerances in the MEMS devices and the placement of the LED dies. This may be accomplished in a number of ways including placing one or more IR LEDs on the MEMS stage that can be used to position the stage relative to a zero point for the purposes of calibrating and aligning the system. This IR emitter could be read by a sensor located in a position that is referenced to the optical system. In this way, the differences in location between the IR LED and the array of microLEDs can be established and used in driving the system.

The transfer of the LED dies onto a substrate that may be placed on the MEMS stage may be a step in the manufacturing process worth considering in separate disclosures: The LED placement may require precision such that variations between light field pixel assemblies fall within reasonable tolerances.

Some driver silicon may also be placed on the MEMs stage to minimize the number of connections between the MEMs stage the driving system.

The MEMS section itself may be a comb drive, a magnetic or thermal actuator, a piezoelectric or another system. The choice of systems will be driven by the scale of the device and required speed and accuracy on the display application side as well as durability on the device side. A CMOS compatible system may allow for the integration of the MEMS, the MEMS stage, the substrate, and signal layout of the display system into a single component.

The microLED section of the display can be constructed in a number of ways. One way would include the structuring of the driver electronics in the MEMS platform itself. This could involve patterning a passive matrix backplane directly onto the MEMS stage as part of a CMOS fabrication process. This could allow for a TFT backplane where the gate and column drivers are placed directly on the microLED substrate.

Additionally there are a variety of options for production the display components including but not limited to microLED. OLED or other displays could be used. The display could be a very small micro-display driven by an active backlight.

For microLED the dominant approaches are the traditional red, green, blue approach and a color conversion approach using phosphor, quantum dots, or some other conversion material.

The MEMs stage may move back and forth in a linear fashion but it is quite possible that the scanning of the MEMs may not happen in the same way from light field pixel to light field pixel.

Pixel one may scan LEDS in a pattern of C,A,D,B,F,C, A,D,B,F,C,A,D,B . . .

Pixel two may scan LEDS in a pattern of D,B,F,C,A,D, B,F,C,A,D,B,F,C . . .

Pixel three may scan LEDS in a pattern of A,D,B,F,C,A, D,B,F,C,A,D,B,F . . .

Varying the scan order may reduce the noise and cross talk between light field pixels. This could be accomplished through a pseudo-random patterning of the system that assures that the scan orders are distributed in a non-ordered way throughout the screen. It may also be necessary to varying the illumination of the LEDs within the scan order to eliminate perceptible scan order when a lower frequency of scan is employed.

The lens stack can also be used to tune the focus of the light source. An optical element directly above the light source that is tensioned in place by a spring much like the optics in a camera module. When required an actuator can move the optical layer relative to the light source defocusing the pixel momentarily. This may allow directors to introduce some more filmic elements into a Light field-based display. This lens stack could be either a traditional lens, a liquid crystal or other variable lens structure.

One possible implementation of the optical chain may display the content reversed and that the image is flipped in the optics of the display. This approach may help with reducing crosstalk.

A complete system may include an array of optical multiplexing packages (OMPs) mounted on a substrate that can be flexible or rigid. The substrate is attached to a physical surface and connected either to a preceding LF module or to a board that functions as a hub in the system taking a subset of the overall data and distributing it to a set of LF modules.

The need for real-time rendering means that there may be advantages to moving the rendering closer to the modules. A set of modules may incorporate one or several rendering devices capable of the real time rendering and display of millions of pixels. Such content would not be stored as a rendered file but would rather be rendered in real time by a game engine such as Unreal or Unity. While traditional camera capture could be part of such a system the files may be stored in such a way that the visual components of the scene are separated so that the model and the texture map and the illumination are all discrete real time elements in the signal chain and can be adjusted for the audience at that moment.

Elements of calibration both for the OMPs and specific environments may be necessary in a processing system designed to drive the displays. A system for local calibration including a stereo sensor system on the robotic arm may be necessary for certain environments.

Since the rendering is all real-time the data could be optimized completely for the single chair. In this way, the entire display can be driven dynamically delivering color, movement, gray scale, and other details in a manner more tuned to the process of human vision.

Component Background

FIG. 1, included here by way of introducing certain components that may be useful in context later, shows a camera module 101 in a modern smart phone, which includes a highly integrated component that may incorporate optics, MEMS actuators, and processing and driver circuitry. The system is accurate enough to track lens focus with 1 to 2 micron pixels. Externally the system includes a can 102 that contains the key components along with a means of attaching the components to a flexible printed circuit board (FPCB) 103 and the primary visible element of the system the optics 104.

Figure 2:
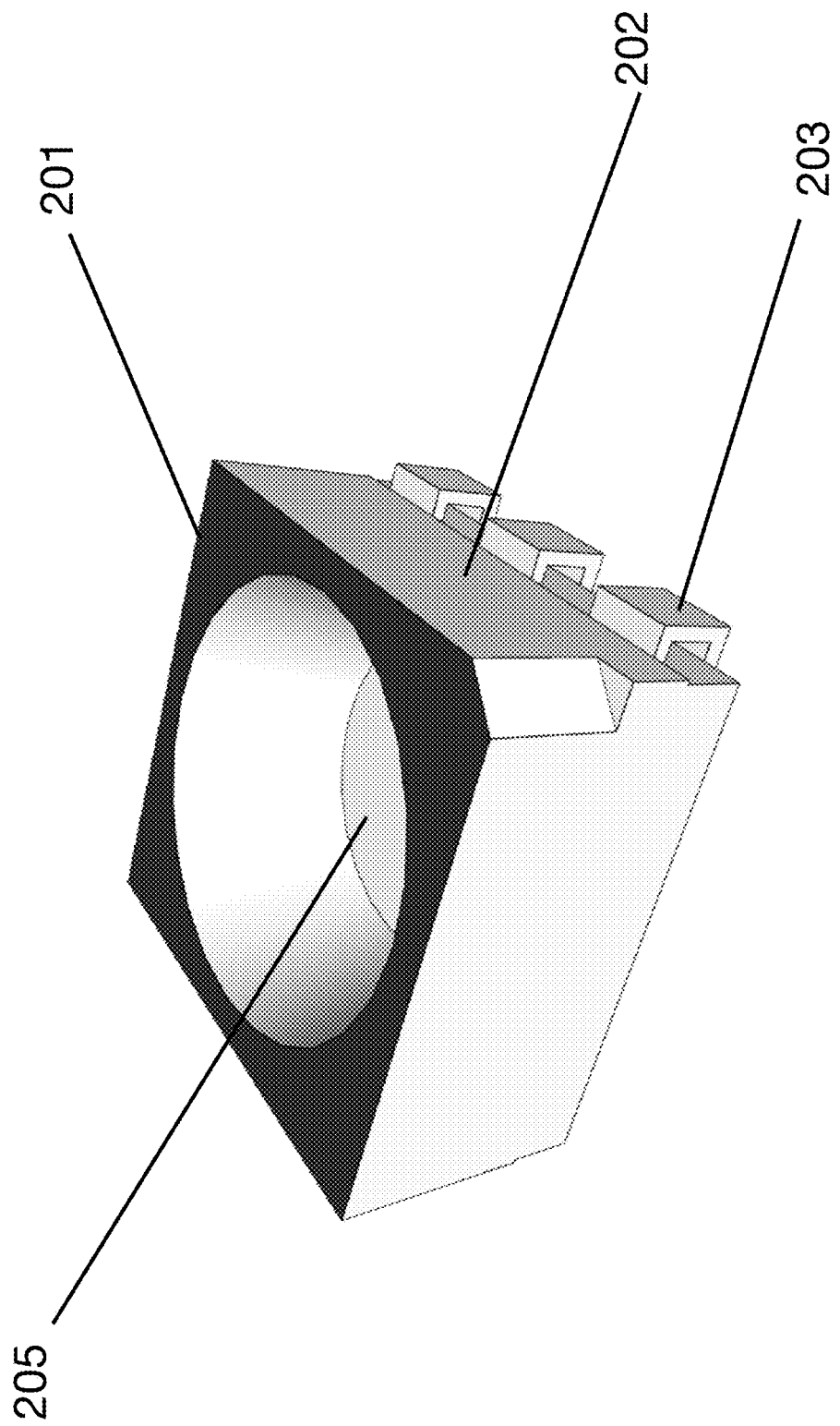
FIG. 2 shows a PLCC6 LED package.

FIG. 2 shows a PLCC6 LED package 201 that could be used by modern LED screens built around surface mount compatible packages. The package 201 features a housing 202 and points to attach to a PCB 203 and then a well 205 that houses the light emitting diodes (LED). The LED dies in the PLCC6 packages may be in the range of 200 to 500 microns. But new technology offers LEDs in the 30-50 micron range. These LEDs, which are the size of grains of pollen, open up the possibility of new designs and markets.

The PLCC package design 201 may be useful because screens may include varying board sizes in order to respond to different market needs and higher resolution screens need the LEDs packed more densely. Creative displays may need linear arrays of LEDs. This modular approach to building large screens of arbitrary dimensions is giving way to different designs using chip-on-board technology and/or incorporating microLED and miniLED. But the modular approach provides a lot of flexibility.

The reasons that the PLCC package is useful may also hold true for Light Field Displays. A large theater scale display could easily be composed of PLCC type packages featuring large arrays of LEDs defining 100s or even close to 1000 different views of a scene that are required in a light field display. And there is a tremendous amount of inefficiency in that layout including the crosstalk between adjacent light field LCDs that needs to be addressed.

For this reason we propose a hybrid solution that takes some elements of the camera module and grafts a microLED array into a MEMS driven optical package to create an Optical Multiplexing Package (OMP).

DESCRIPTION

Figure 3A:
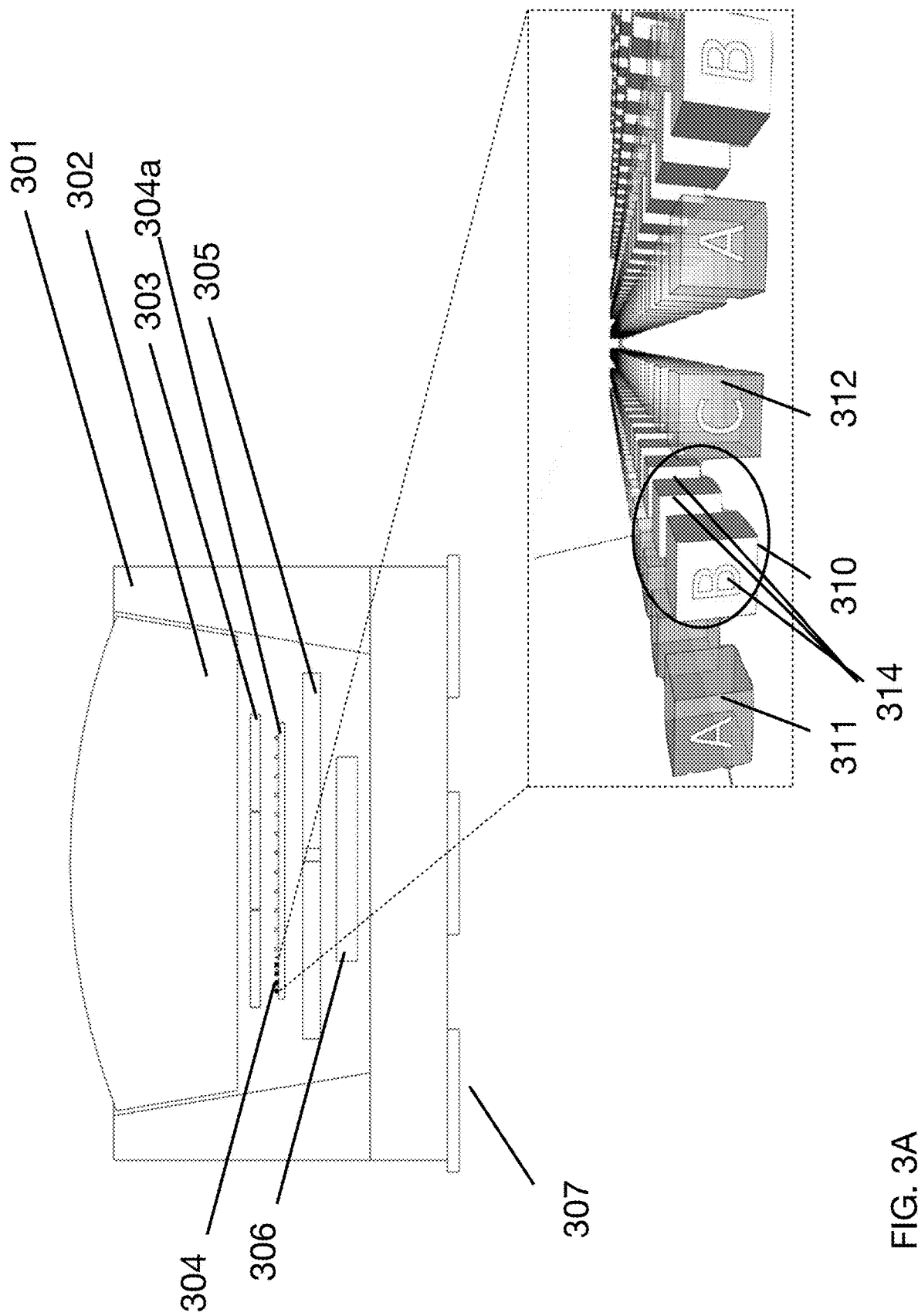
FIG. 3A shows a short travel light field package elevation view.

FIG. 3A shows an embodiment where the OMP 301 is a component that includes an optical output 302, optical filter 303, and an array of microLEDs 304 arrayed on a stage 304a mounted on a linear comb-based MEMS device 305 that is distributed in such a way that the stage 304a moves side to side and each corresponding single row of LEDs moves with the stage 304a in either direction such that from Column B 310, the system only needs to move under 60 microns in either direction (60 microns being one possible distance between each LED) to place Column A 311 and Column C 312 in the correct position for the optical system to output a different corresponding signal. It should also be appreciated that multiple of the LEDs (A, B, C) may comprise a pixel 314 thus combining to display different colors. This MEMS device 305 and stage 304a movement may be coordinated by a driver 306 built into the package 301.

The LED stage 304a may include the LED driver circuitry reducing the number of connections required from the primary driver to individual red, green, and blue LEDs. In theory the system could add white LEDs or additional LEDs that are not RGB to expand color spectrum by adding two more rows of travel to the MEMs stage.

The programming of the MEMs stage 304a could also control the duty cycle of each supplemental picture element such that white or cyan (as examples) could be used as needed leaving the primary drive to the RGB pixels.

The package 301 may integrate a driver 306 to control the movement of the stage 304a and any active optical elements in addition to maintaining a clock across the system and between the stage and the illumination of the LEDs 304.

Figure 3B:
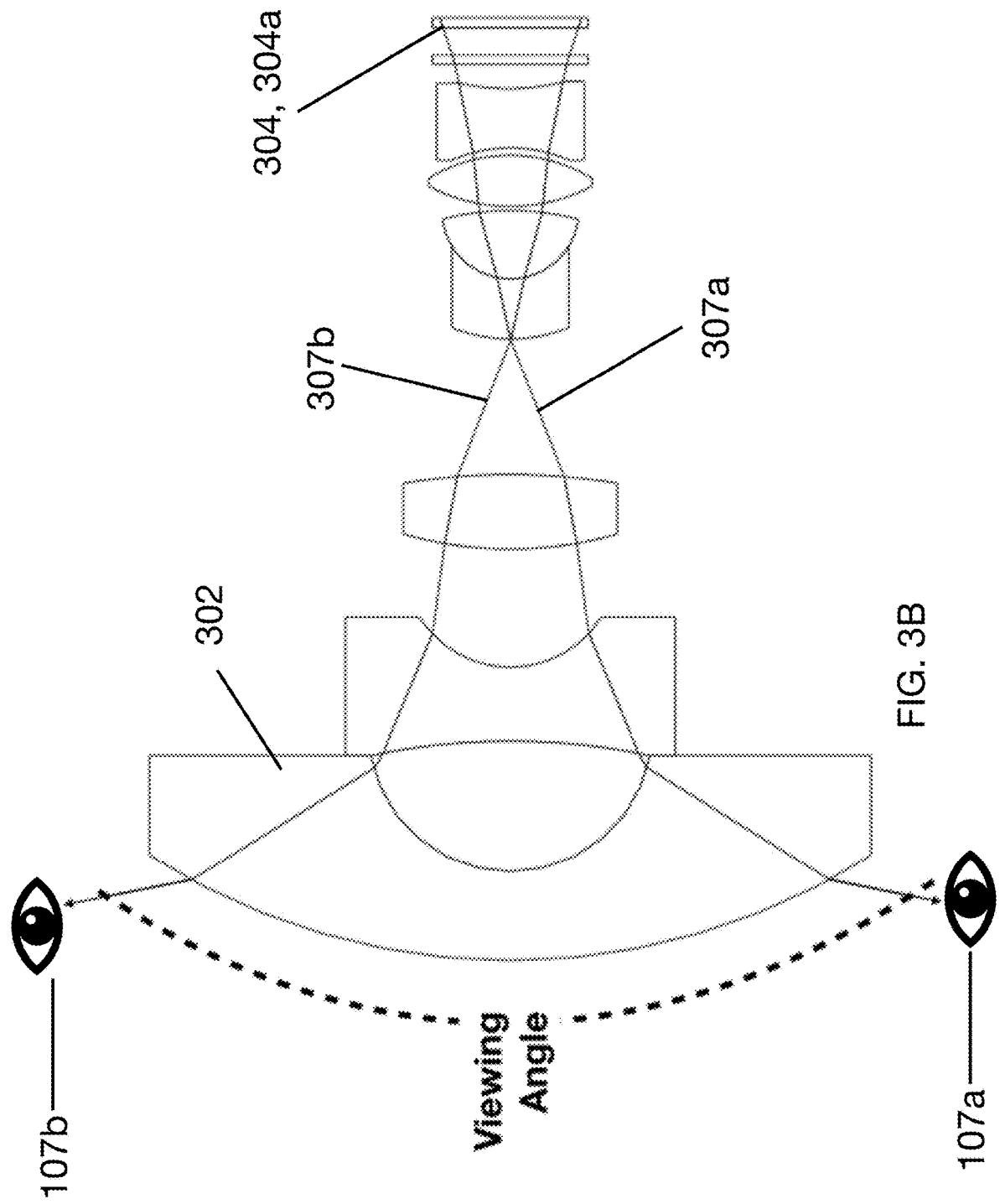
FIG. 3B shows an illustration of light paths through a lens that could be used with a package.

FIG. 3B shows a mockup of a stage/LED 304a, 304 projecting light 307a, 307b that on its way to viewers 107a, 107b is reversed (though this is not required). This inversion may be helpful because viewers may see different or limited portions of the stage/LED array and the cross over in the optical path may be useful in reducing any crosstalk between adjacent light field pixels contained within the package. What should be appreciated from this view is that the lens 302 acts to bend the light 307a, 307b and although viewers are shown at extreme viewing angles, a single viewer's two eyes could receive different light waves and in so doing, receive outputs from a package or array of packages that renders objects in 3 dimensions. Other parallax or lenticular lensing could achieve a similar effect. In some embodiments, the MEM could be similar to a series of wiper blades passing across the back of a curved input optic.

Figure 4:
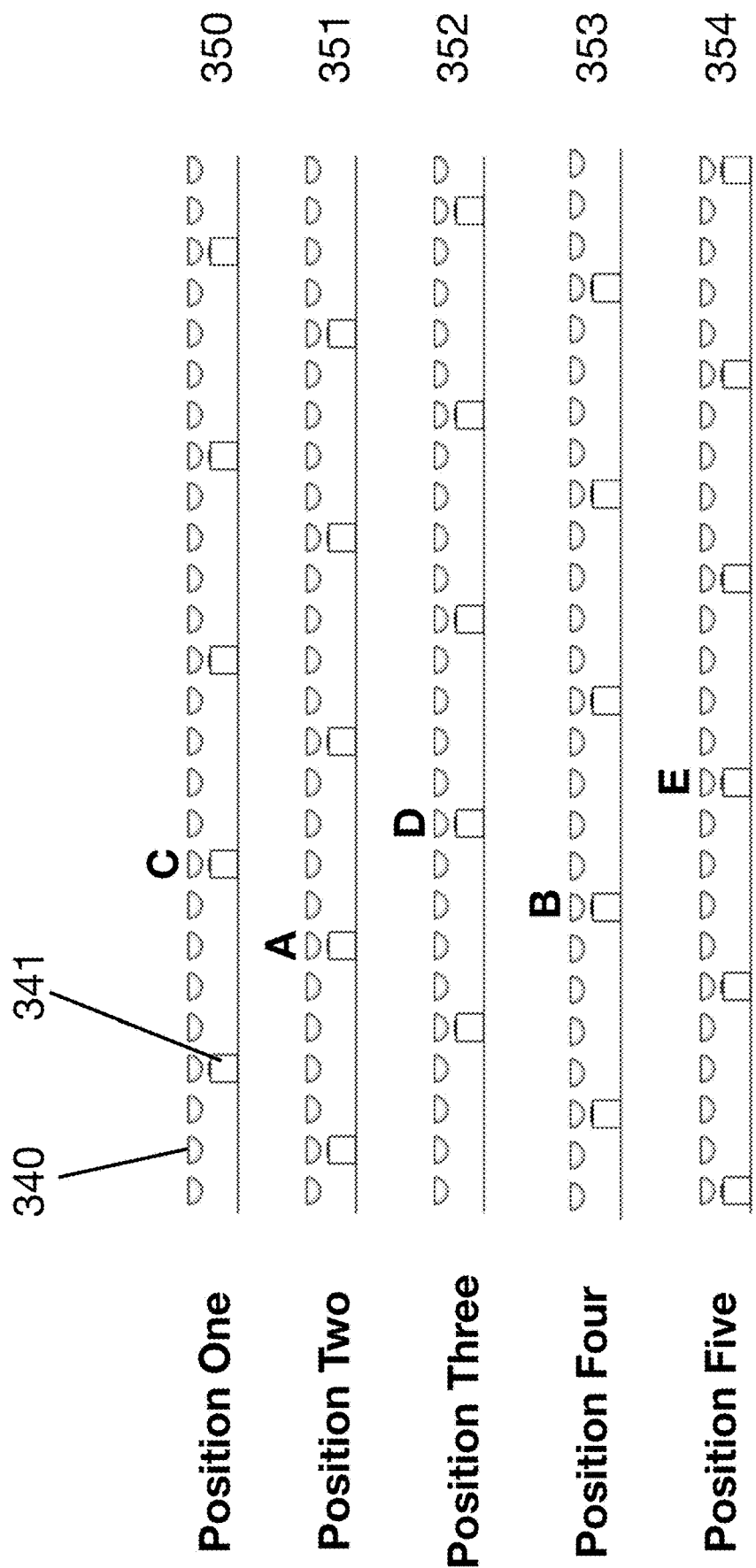
FIG. 4 is a figurative example of optical multiplexing.

FIG. 4 shows the lens array 340 and the miniLED array 341 at five points in time. Moving from a first position 350 through a fifth position 354. This is illustrated in such a way that the miniLED array never moves from one column of LEDs to an adjacent column. So we move from 350 in position C to 351 in position A to 352 in position D to 353 in position B to 354 in position E. Although the display could scan in a linear manner it is possible that this will product visual artifacts.

Figure 5:
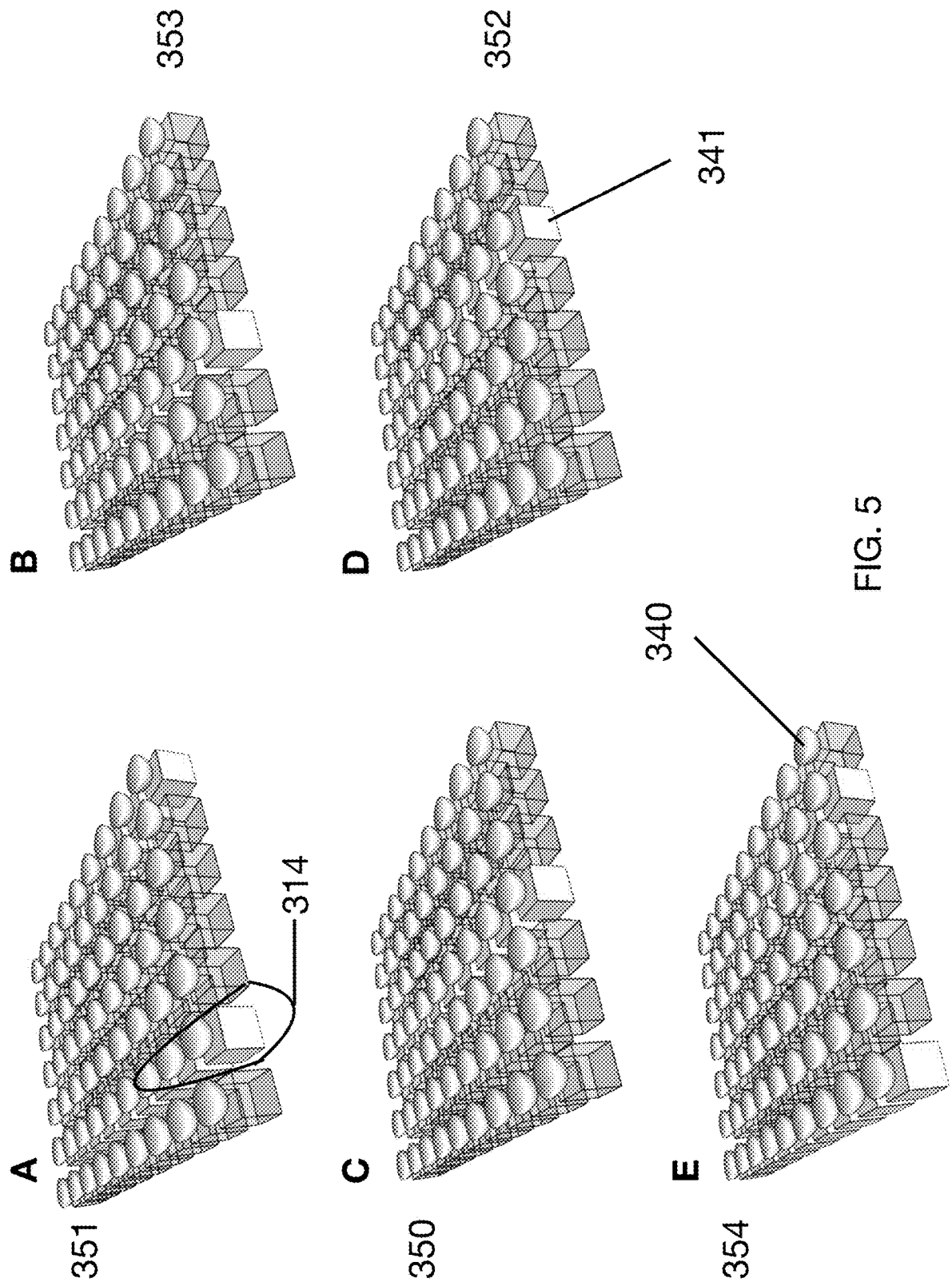
FIG. 5 is another figurative view of optical multiplexing.

FIG. 5 shows the lens array 340 and the miniLED array 341 illustrated showing the active LED and pixel 314 (where a pixel is again multiple LEDs 314) locations along with ghosted/lightened positions showing all the active locations in the system. You can see that position E 354 and position A 351 illustrate two active pixel columns since at this point the illustration contains two columns of pixels in those positions.

Figure 6:
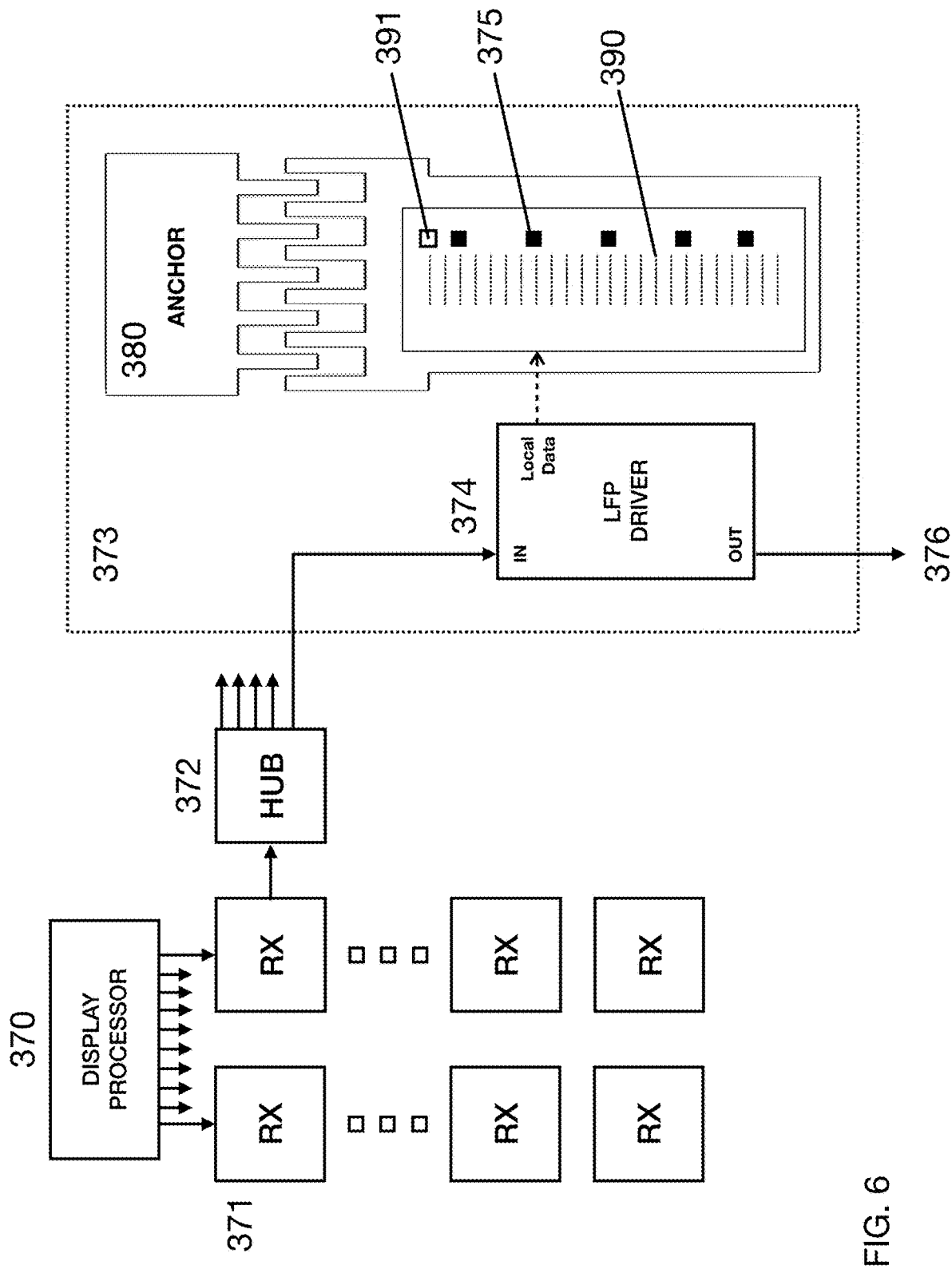
FIG. 6 shows signal flow through components.

FIG. 6 shows a single light field package 373 that is one small part of a larger system. The signal originates in a display processor 370 that contains a map of all the pixel and/or LED locations. This map outputs data and that data hits a receiver card 371 that extracts the local data for that section of screen. This data is output via a hub 372 that integrates the receiver card 371 with the LED panel. The output of the hub 372 will possibly hit many LED modules within a panel. In the panel the data often cascades from light field package to light field package. Each light field package 373 may contain a driver 374 that supplies local data to LED drivers 375 along with the MEMS stage 380 and the IR LED 391.

Figure 7:
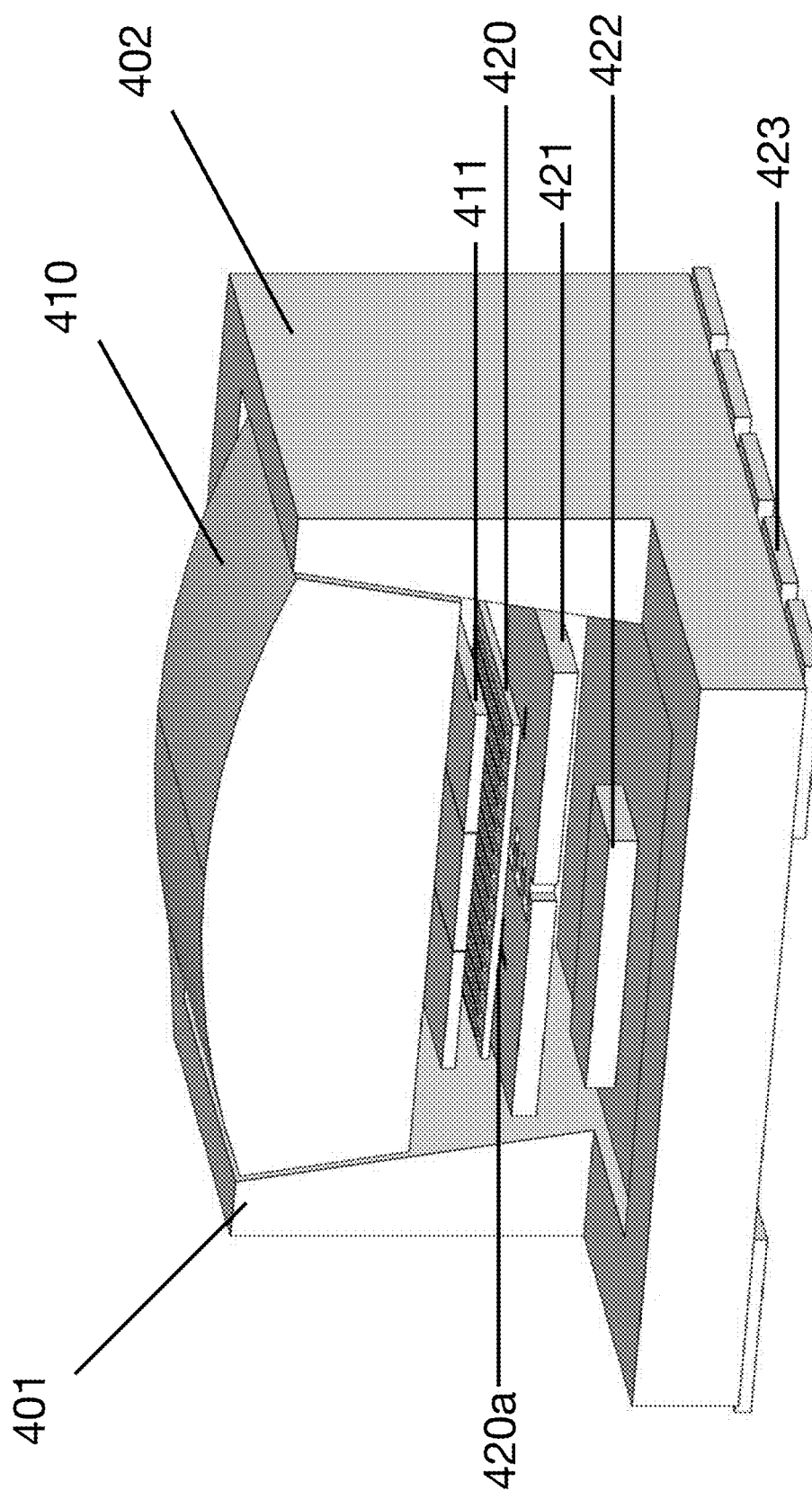
FIG. 7 shows a short travel light field package.

FIG. 7 shows a package 401 that shares many elements of the PLCC6 package 301 and could be used with standard pick and place equipment. The light field package 401 contains an optical system 410 designed to distribute the output in a roughly lambertian manner although this can be optimized for linear distribution since that may be desirable in many cases. There may be a secondary optic 411 that either collimates the output of the light sources or acts as a mask.

The electrical functions of the light field package 401 may be defined by the arrangement of the light emitters 420 on a stage 420a driven along a linear path by a MEMs actuator 421 controlled by an integrated driver 422. The light field package 401 may be connected using a surface mount compatible array of conductors.

Figure 8:
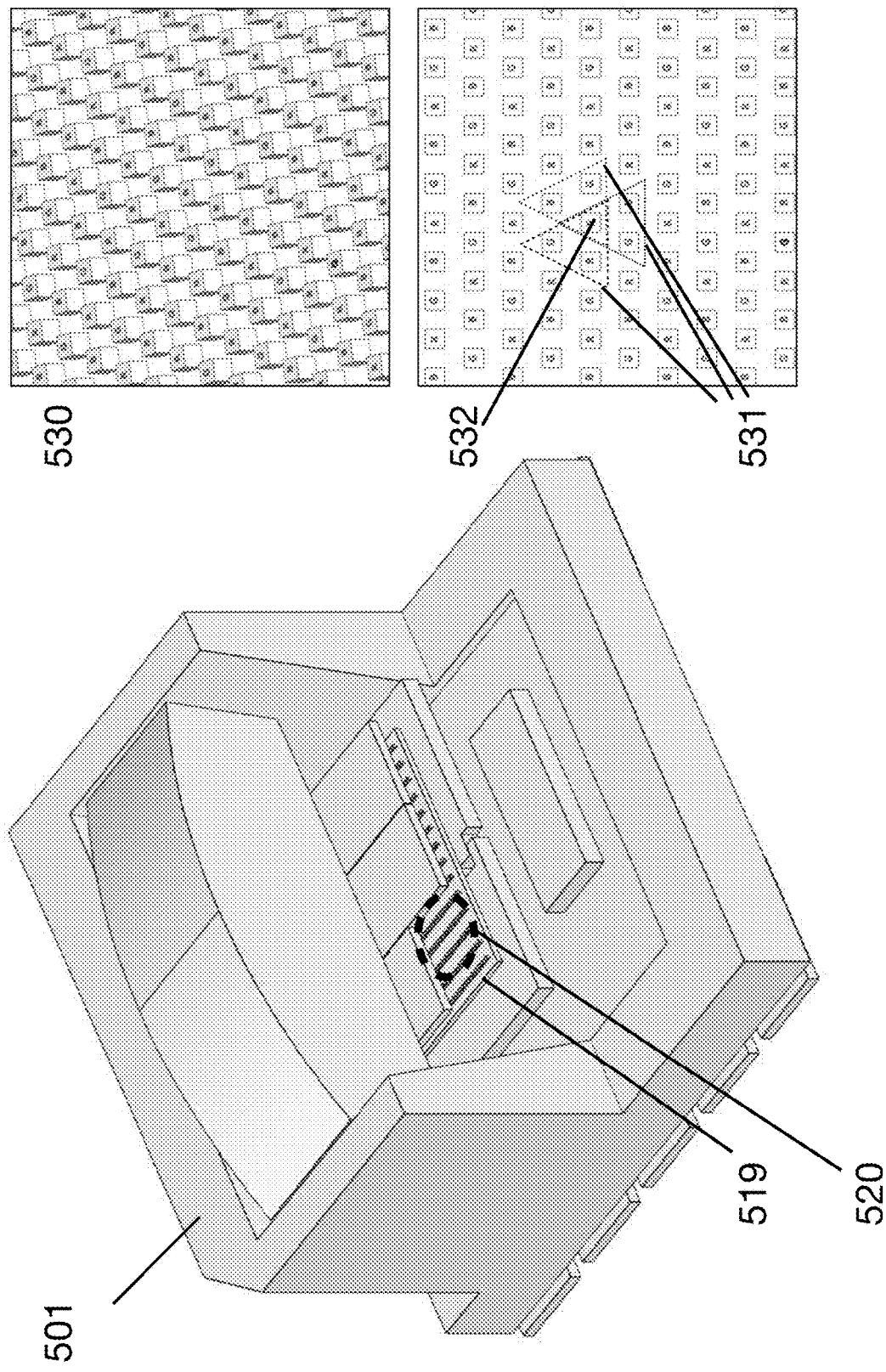
FIG. 8 shows a short travel light field pixel with a cutaway to expose a microLED array.

FIG. 8 shows a short travel light filed package with exposed microLED array 501 having a stage 519 holding the microLED array 520 is shown. The LED arrangement can be linear or the LEDs (labeled R, G, B to indicate possible colors) or another light source can be arranged in a triad arrangement 530 allowing a red LED 532 to be part of several adjacent pixels 531.

Figure 9:
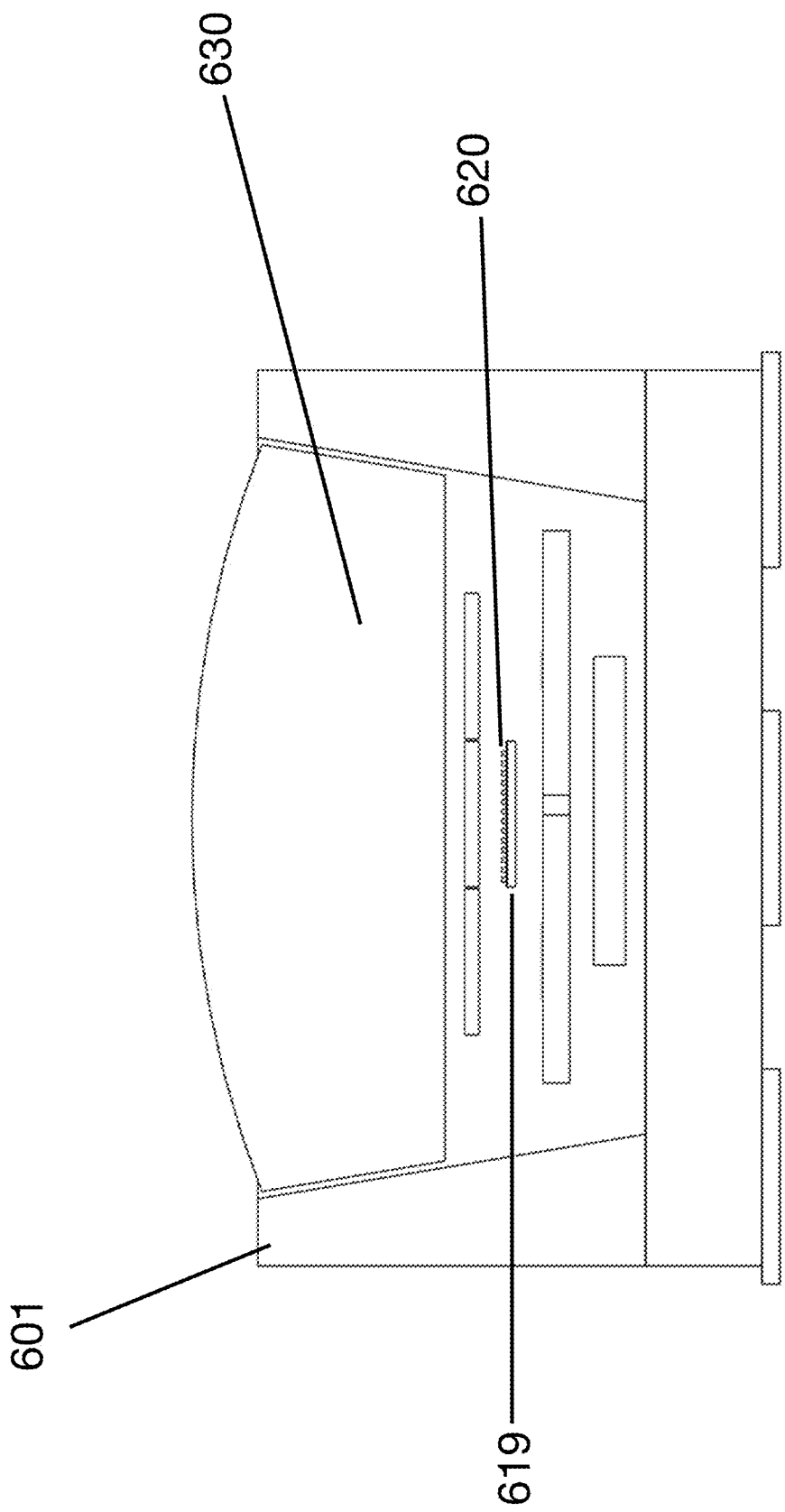
FIG. 9 shows an elevation of a long travel light field package with closeups of RGB LEDs and pixels.

FIG. 9 shows a long travel light field package elevation in which an alternative embodiment delivers a package 601 that uses a smaller stage 619 to move a more compact array of light sources 620 across the back of a static optical system 630. This may have advantages in production allowing for the use of a smaller substrate for the light emitting array and could be more desirable where more optical multiplexing is possible. Comparing this long travel package 601 to the short travel package 401, it should be appreciated that the stages are different sized, as is the LED spacing, which would require more or less travel of the respective stages respectively.

Figure 10:
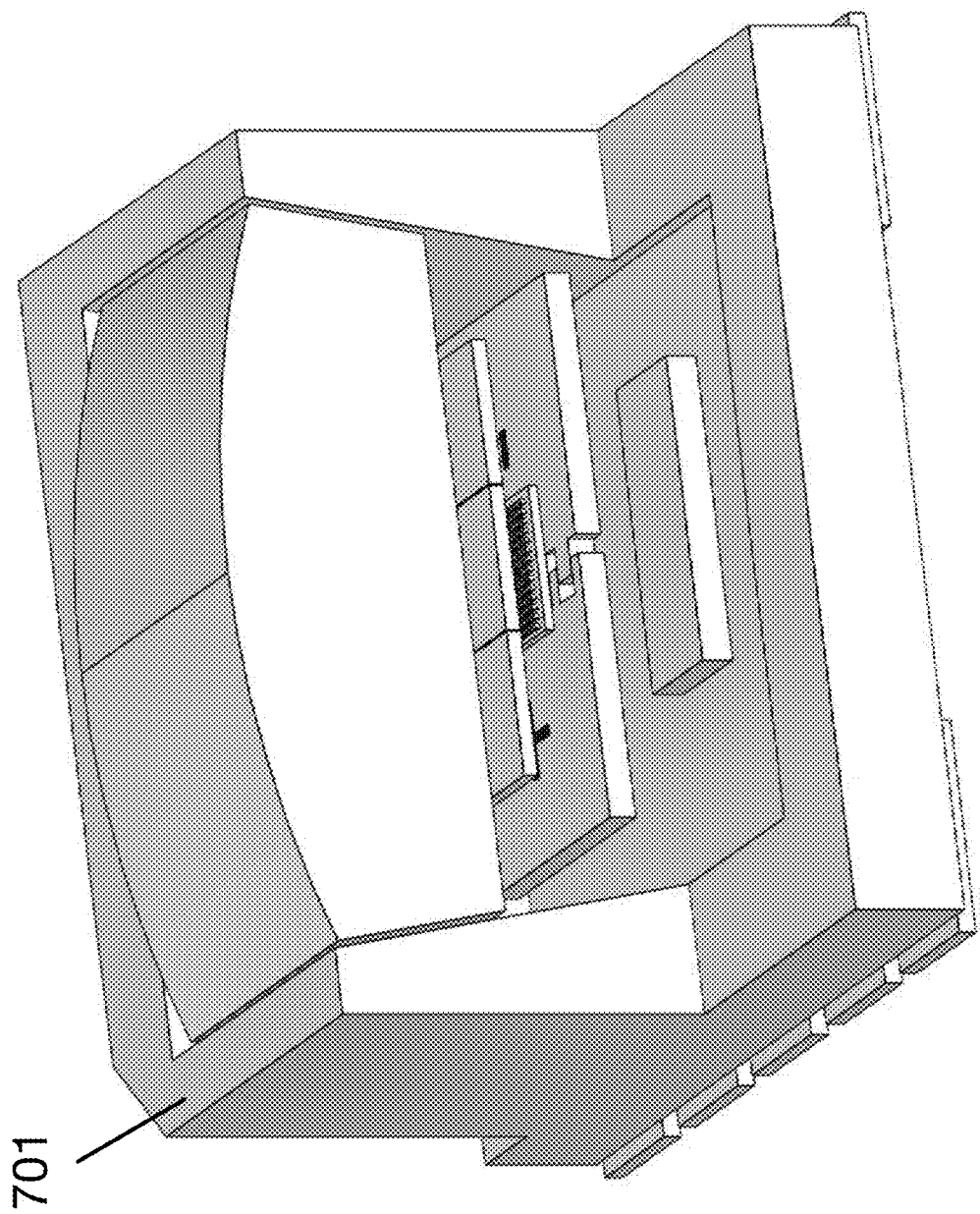
FIG. 10 shows an illustration of a long travel light field package.
Figure 11:
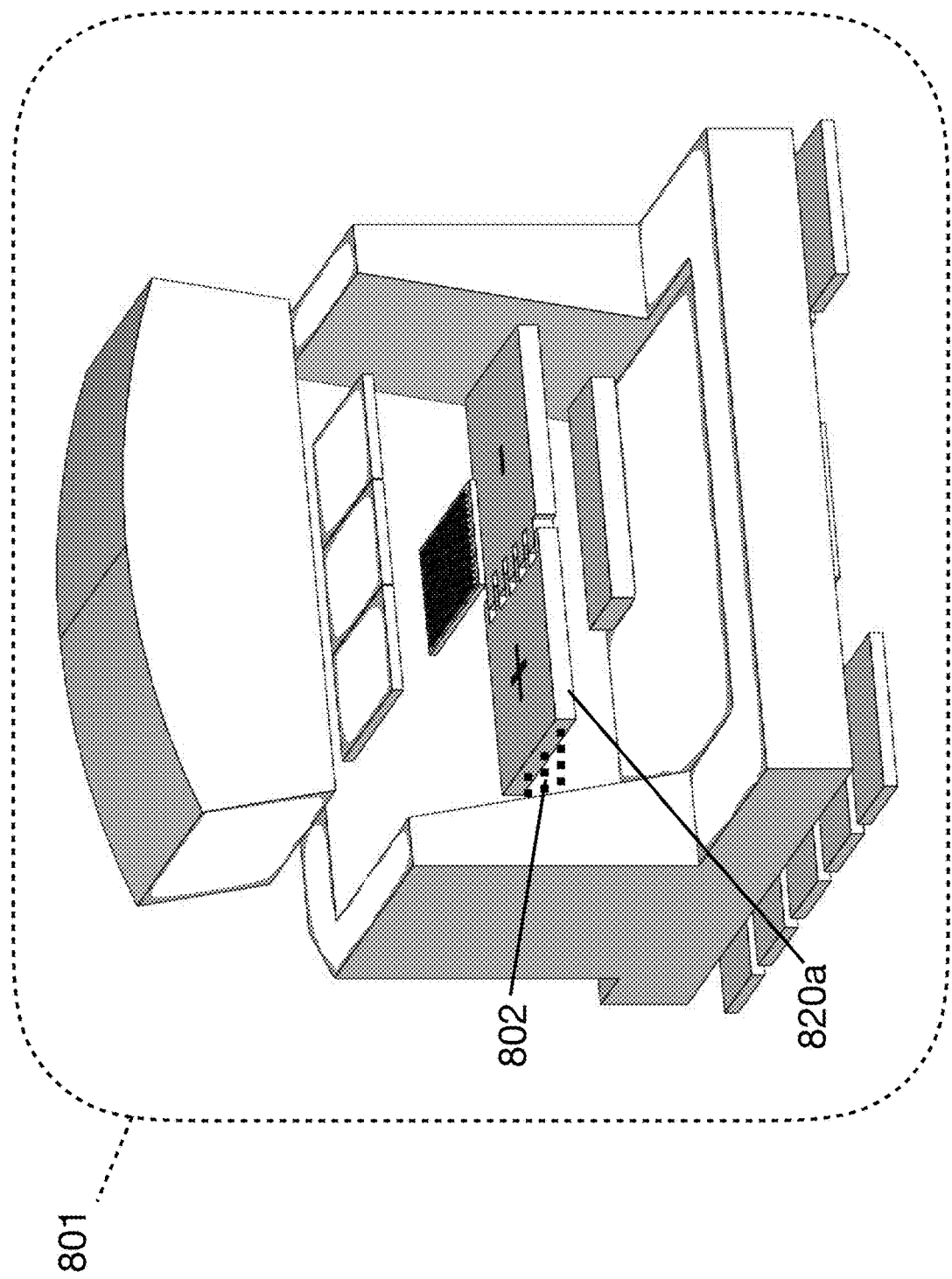
FIG. 11 shows an exploded view of a long travel light field package.
Figure 12:
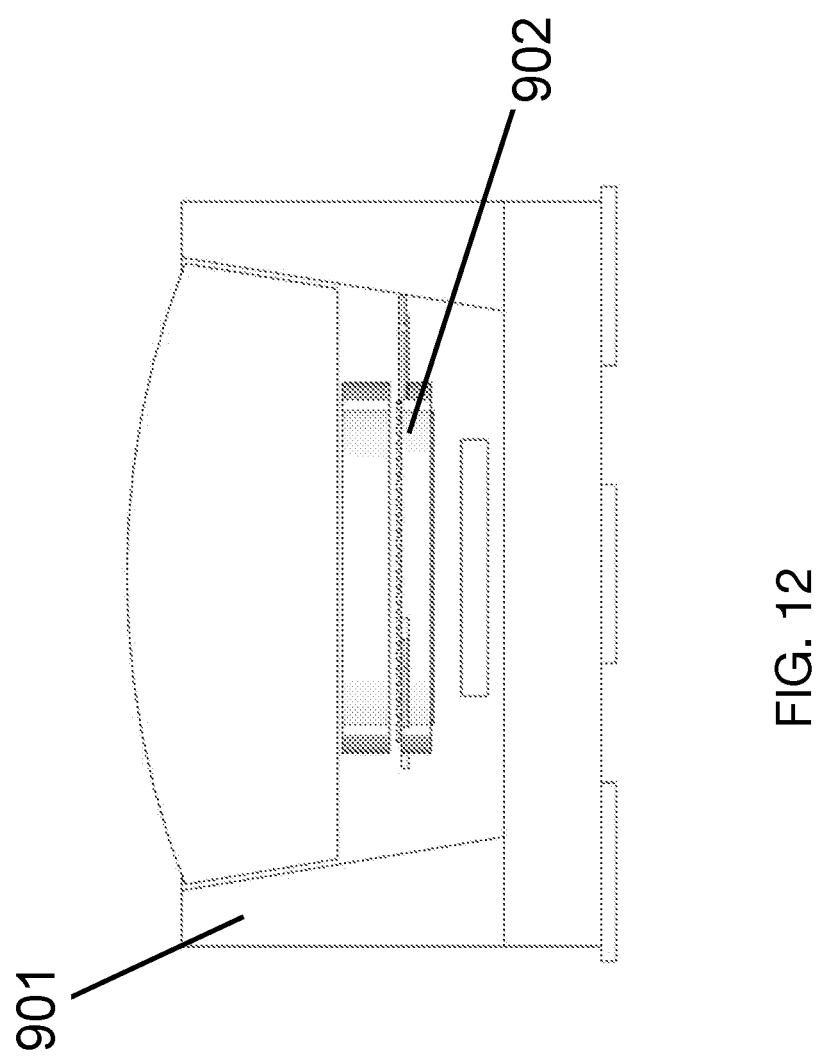
FIG. 12 shows an elevation of a twist light field package.

As shown in FIGS. 10 and 11, a system using a longer travel may be able to dynamically address pixels based on utilization much like a print head only applying ink where it is needed. In a system representing 54 pixels in the horizontal axis the MEMS stage would need to travel a little over two millimeters or a little over one millimeter either side of a center or default position.

As seen in FIG. 11, the long travel system 801 may rely more on the effect of a spring 802 or springs to rapidly shift the stage 820a back to the default position.

FIGS. 12-15 shows an alternative embodiment of a twist light pixel that uses a rotating stage 902 to move the LED packages around a central axis. This may be optically more complicated but the design may offer a variety of options to use discreet red, green, blue, cyan, orange, and white MicroLEDs to create virtual pixels with extended dynamic range.

Figure 13:
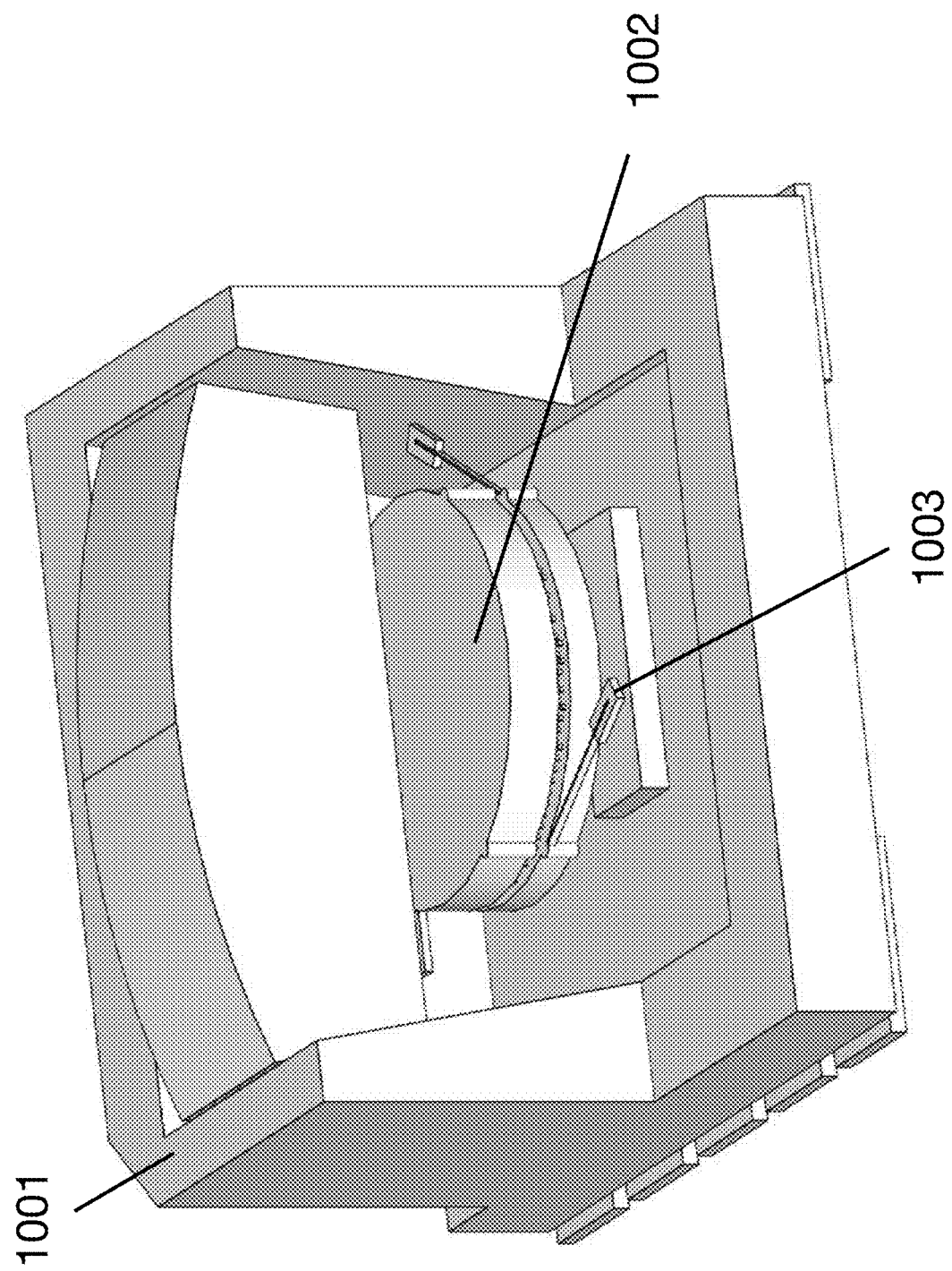
FIG. 13 shows a twist light field package.

As seen in FIG. 13, the MEMS stage 902 in the twist system 1002 is driven by three posts 1003 that shift on a hinge rotating the LED stage behind the optical system. One concern with a rotating stage is that the LEDs at the center of the stage would be covering a smaller display area than the LEDs at the outside of the stage meaning that they would operate at different duty cycles, but this could be compensated for by the driver.

Figure 14:
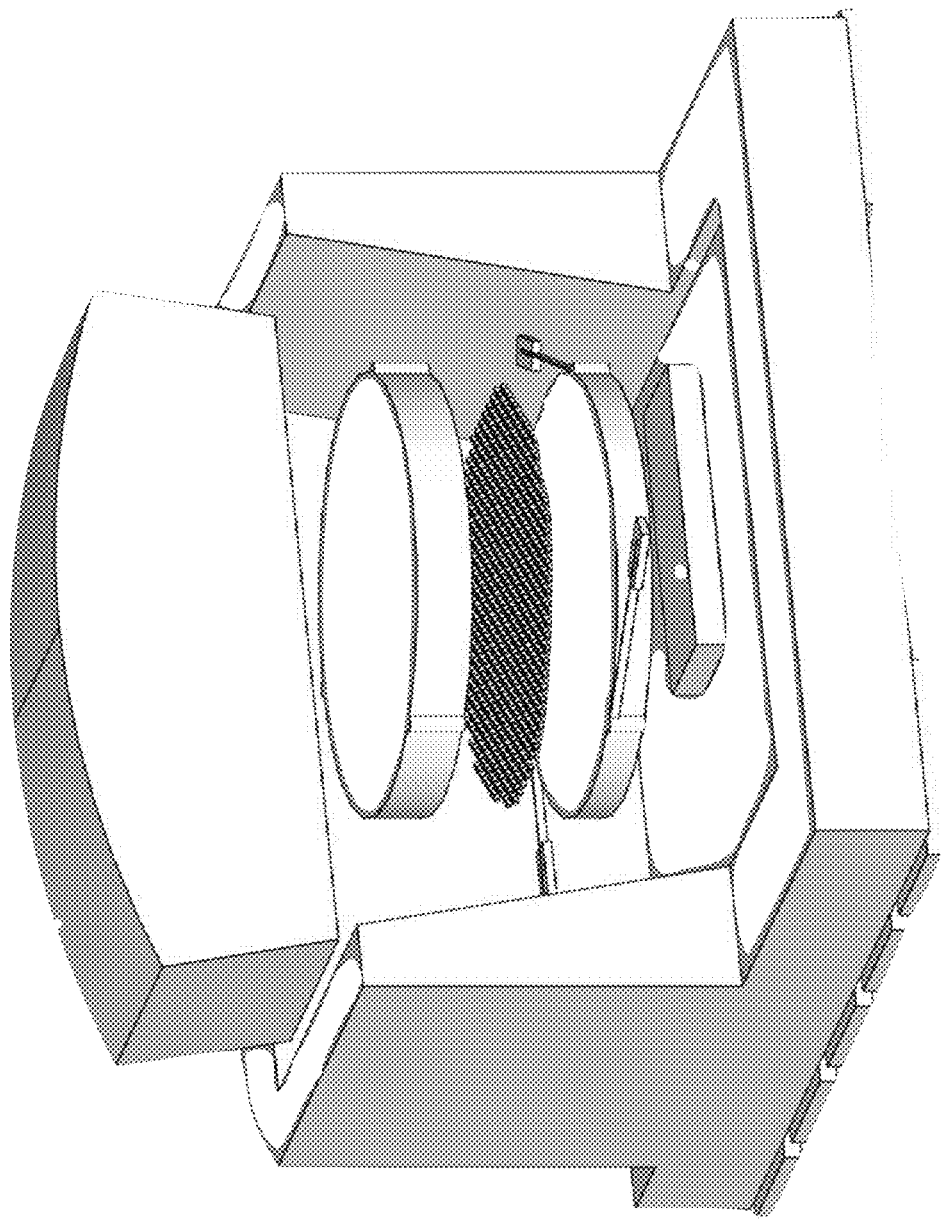
FIG. 14 shows an exploded view of the twist light field package.

FIG. 14 shows that the system could use groupings of red, green, and blue LEDs or a system of discreet LEDs of varying colors as illustrated in the dense LED array. This array could be configured in a variety of different positions so that red, green, blue LEDs pass a specific optic relating to one viewing angle. And additional LEDs could be added to expand color spectrum.

Figure 15:
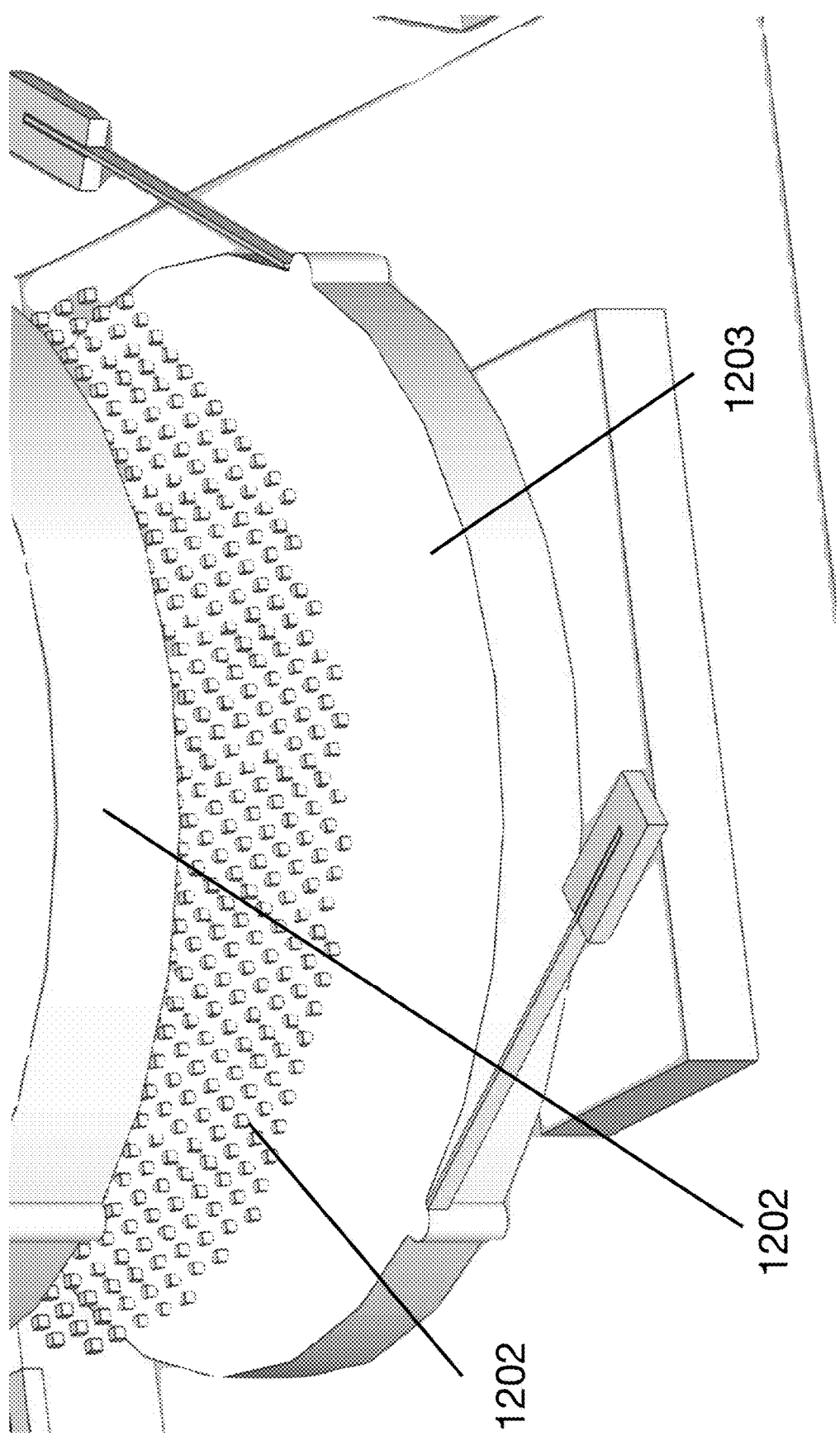
FIG. 15 is a detail view of the exploded view of the twist light field package LED array.

As seen in FIG. 15, the array of LEDs 1202 can be seen separated from the stage 1203 and the optic 1204.

Figure 16:
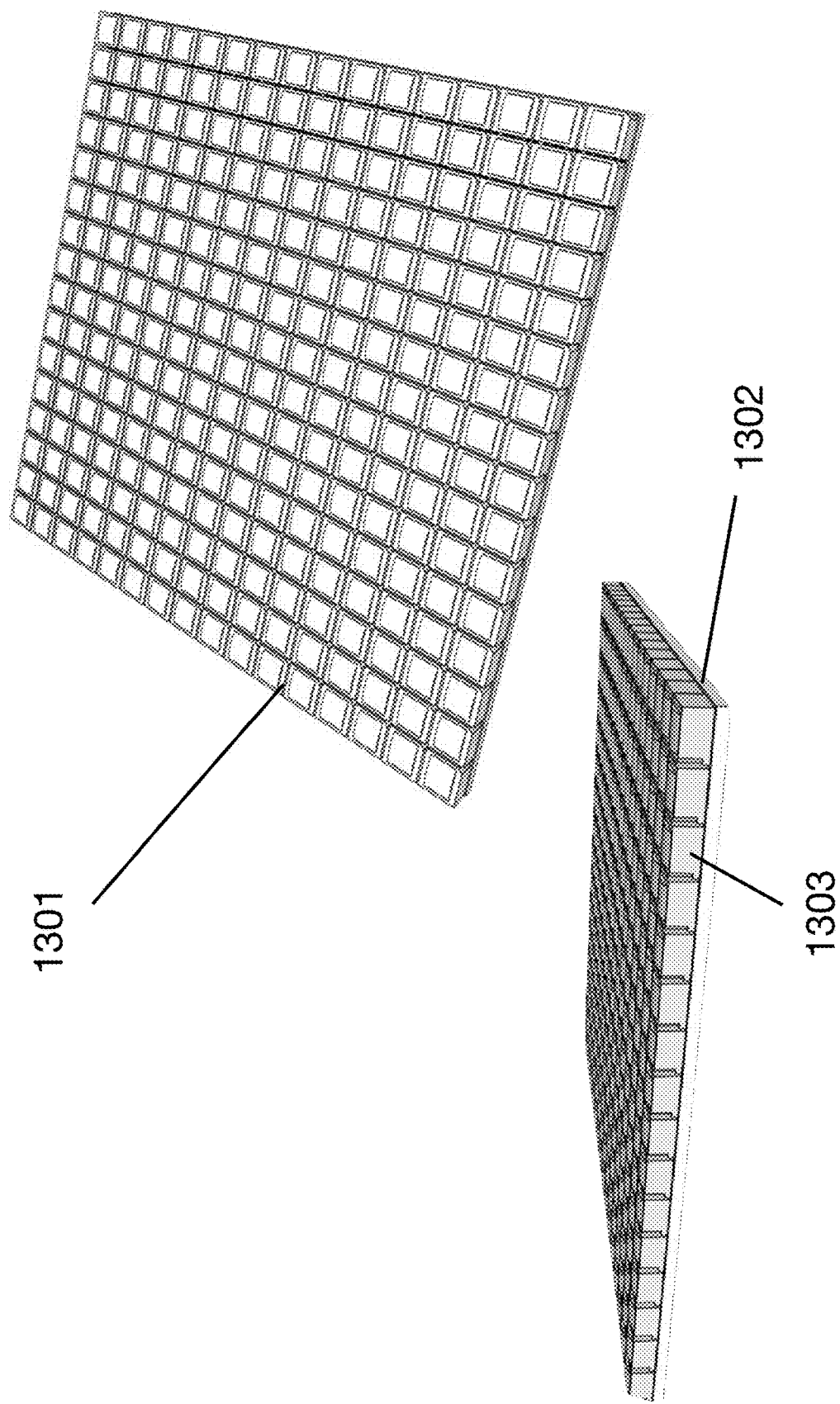
FIG. 16 shows a light field display module.

FIG. 16 shows a light field pixel display module, in which the assembly 1301 is built around a PCB 1302 that is populated with LED packages 1303. But in this design, the LED packages are light field display packages. The illustration shows a 16×16 array of pixels each representing 256 points of view or approximately 65,000 light field subpixels.

Figure 17:
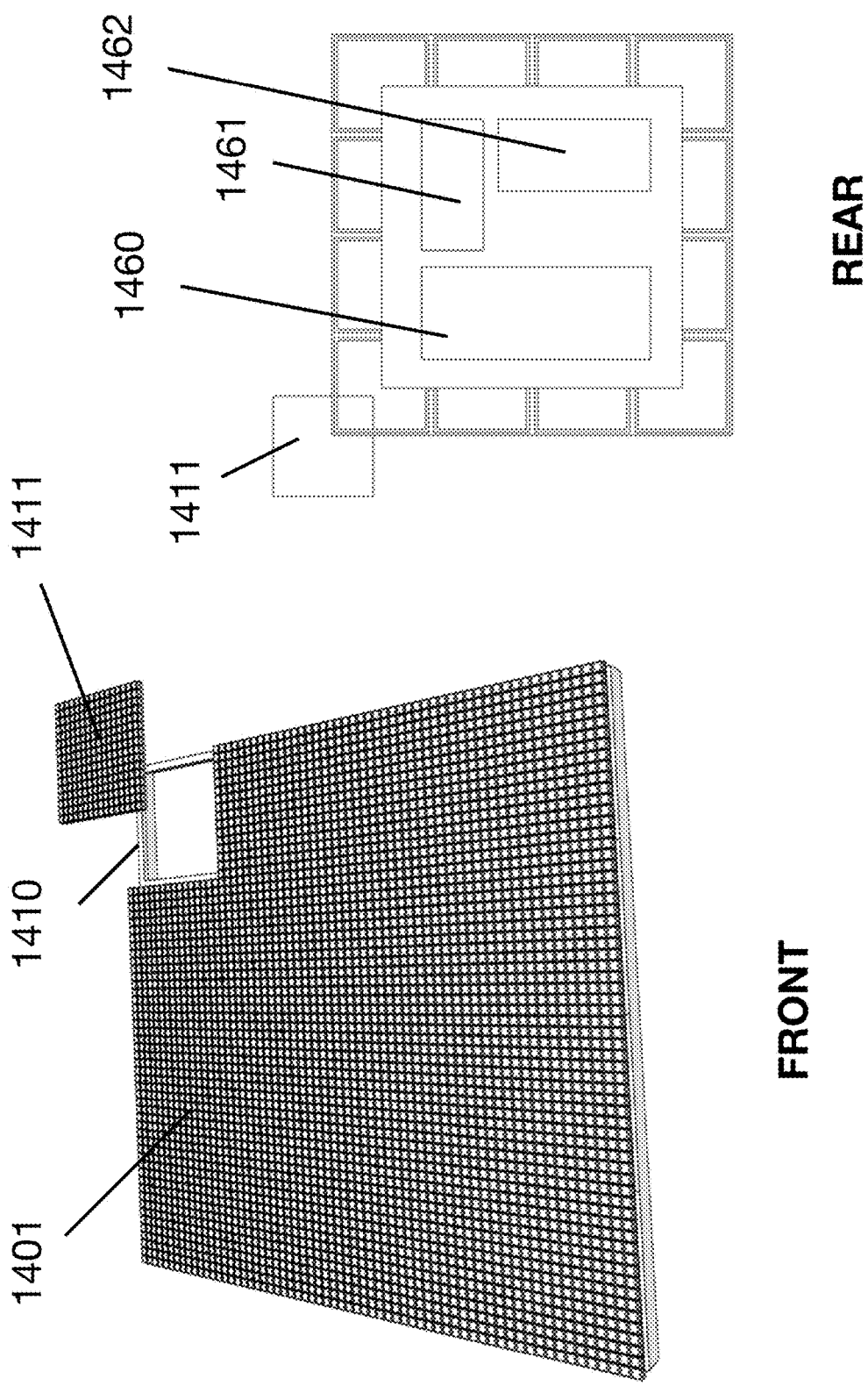
FIG. 17 shows a light field panel.

As shown in FIG. 17, the mechanical systems used in LED displays currently can be adapted easily for use in light field displays. Here a panel 1401 comprising sixteen light field display modules 1410 are mounted on a frame 1411 that houses the power 1462 and data distribution 1460 in addition to a small localized content server 1461 that may be used because this panel 1401 alone contains one million pixels.

Figure 18:
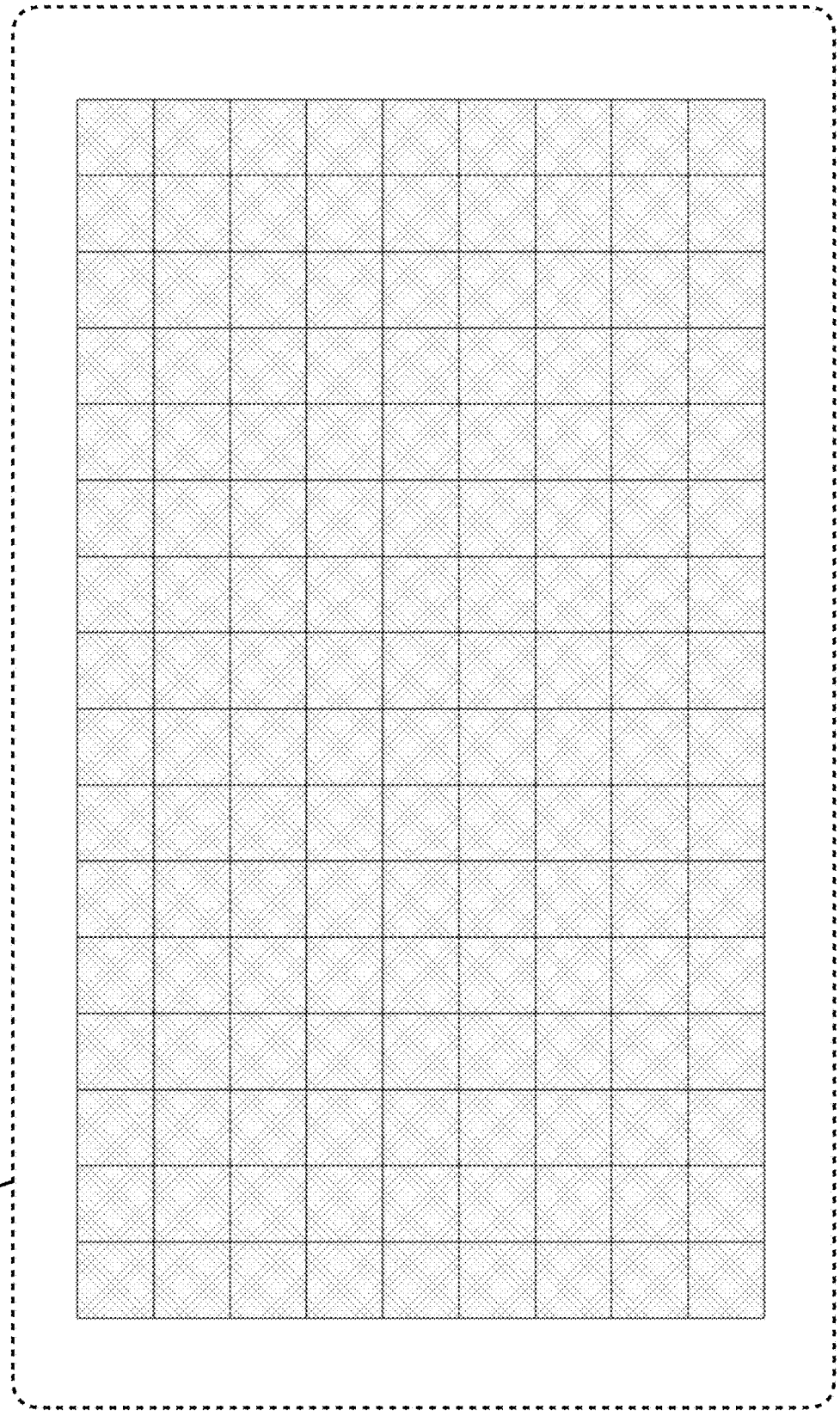
FIG. 18 shows a light field display wall.

FIG. 18 shows a light field pixel display wall in which the panels can then be arrayed so the wall 1501 delivers a single contiguous image. In current LED walls these are primarily 2D images. A light field display, in contrast, is capable of delivering three dimensional images from a variety of viewpoints without the use of glasses. The display system, whether it is used in a flat traditional screen application or used in a dome or sphere application, would be able to deliver a different experience to every viewer based on their location in the space.

Figure 19:
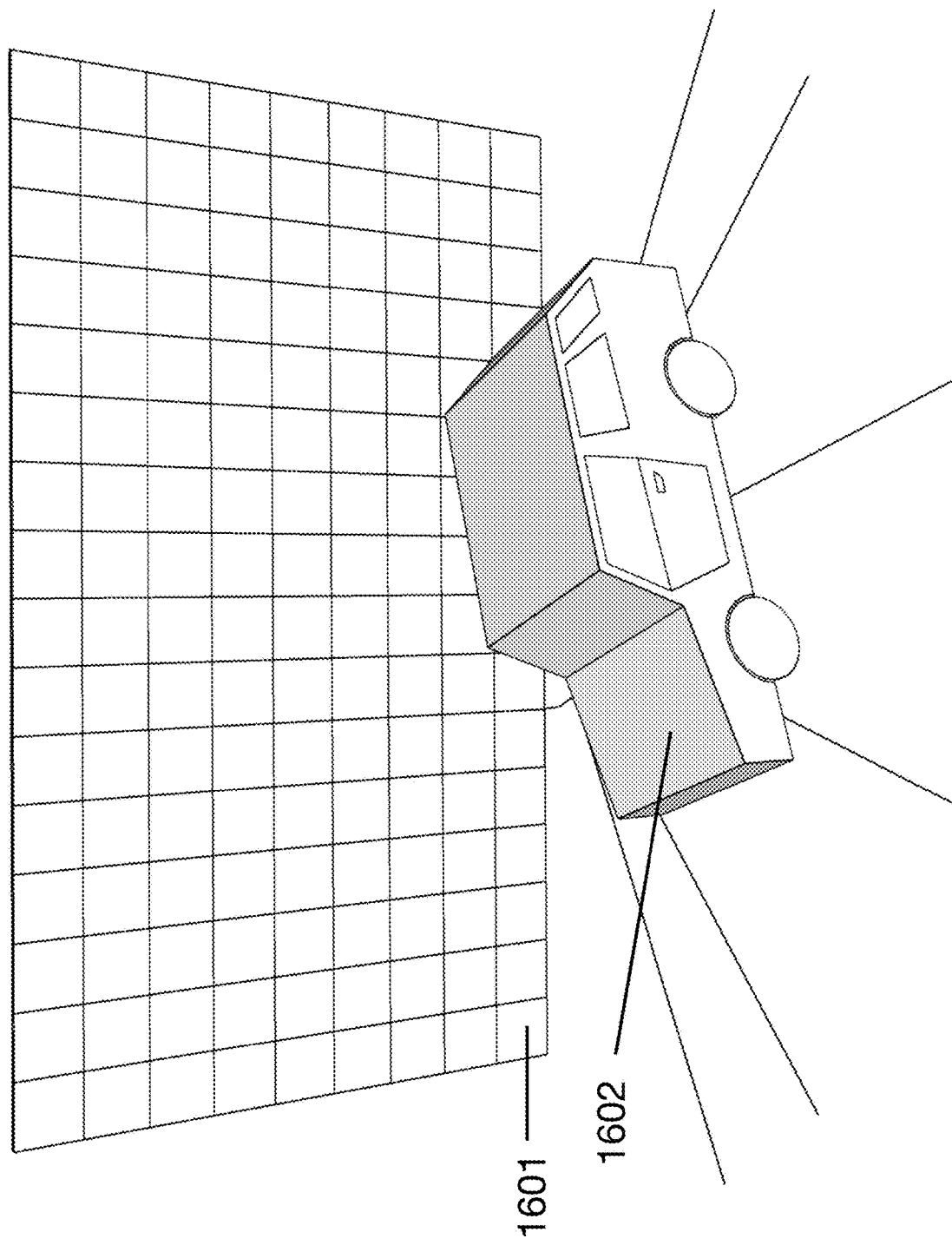
FIG. 19 shows an application of the light field display with a conceptual car.

FIG. 19 shows an application using the example of a car 1602 and a flat display 1601 that the car could be viewed from between 48 and 180 different views depending on the LED array used in the light field pixel. The number of views may be a function of engineering and cost but it can be appreciated that large screens featuring more than 180 discreet horizontal views are possible.

Figure 20:
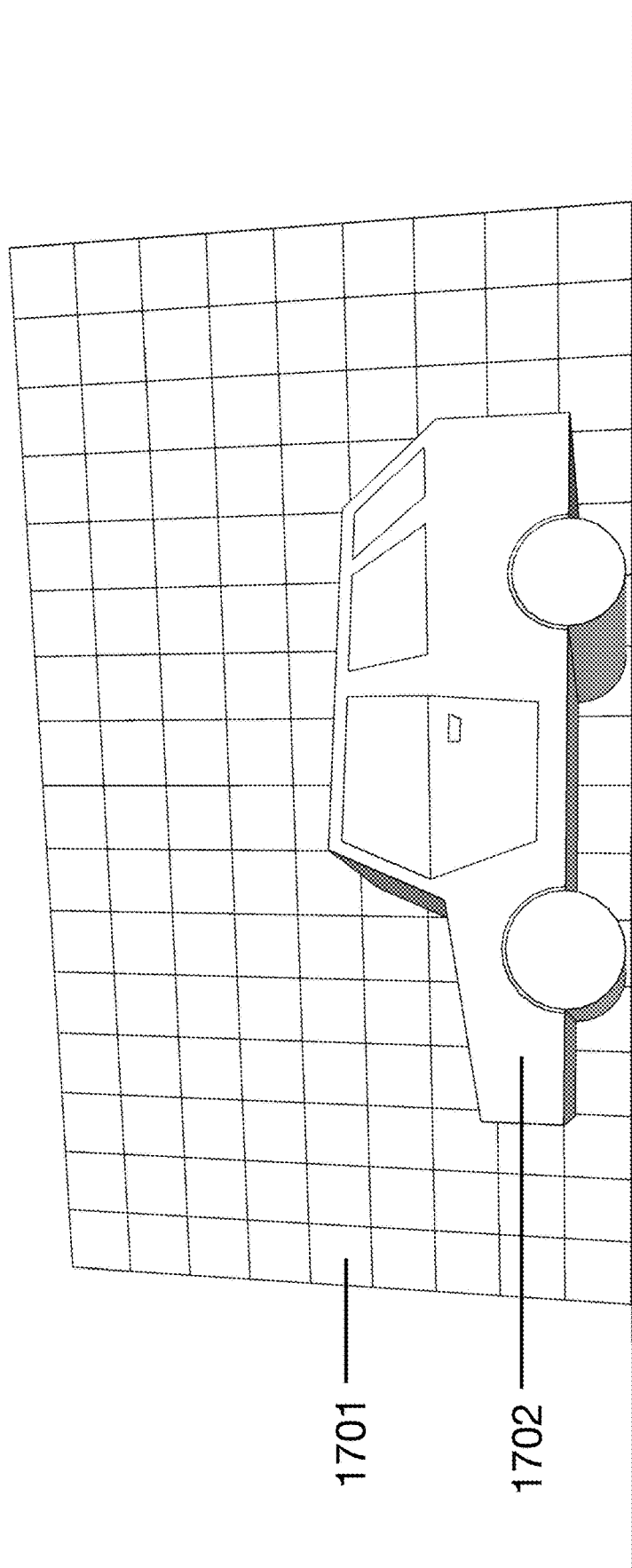
FIG. 20 shows an application of a light field display with a car in a first view.
Figure 21:
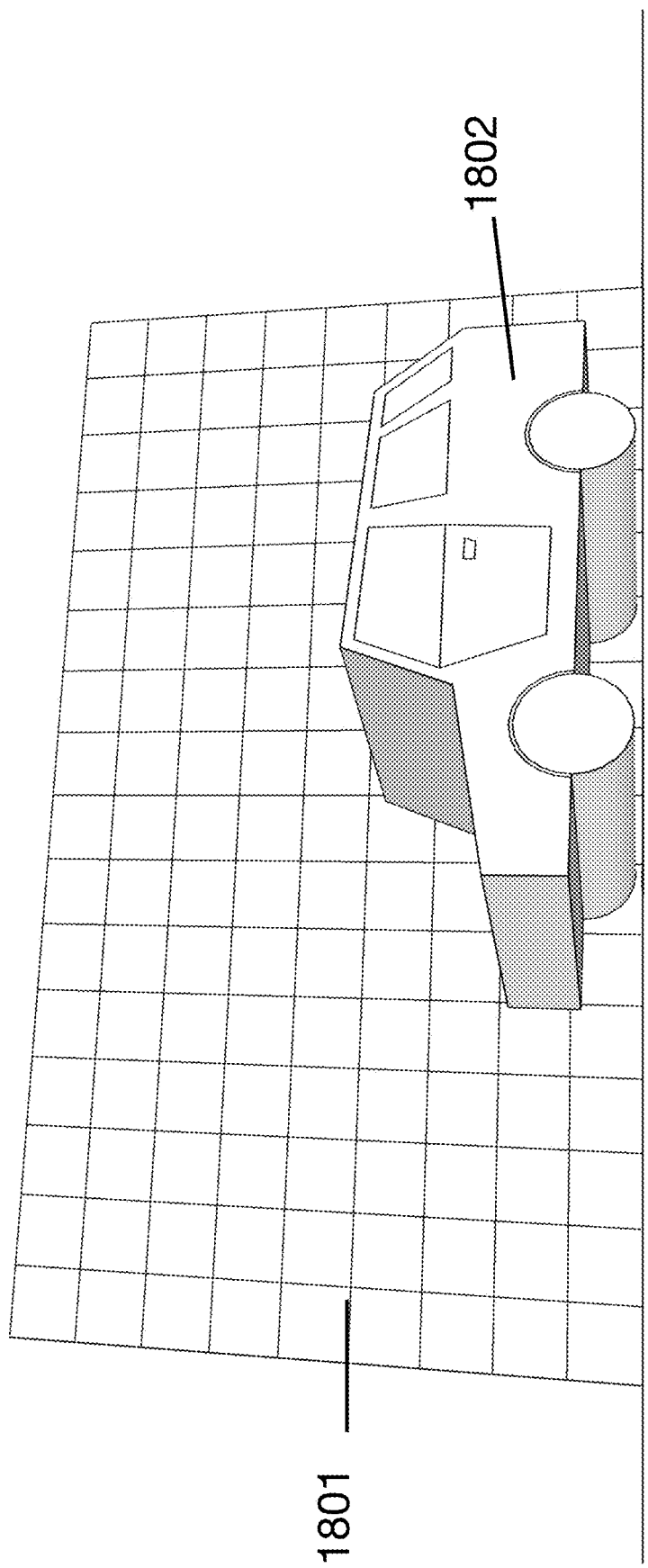
FIG. 21 shows an application of a light field display with a car in a second view.
Figure 22:
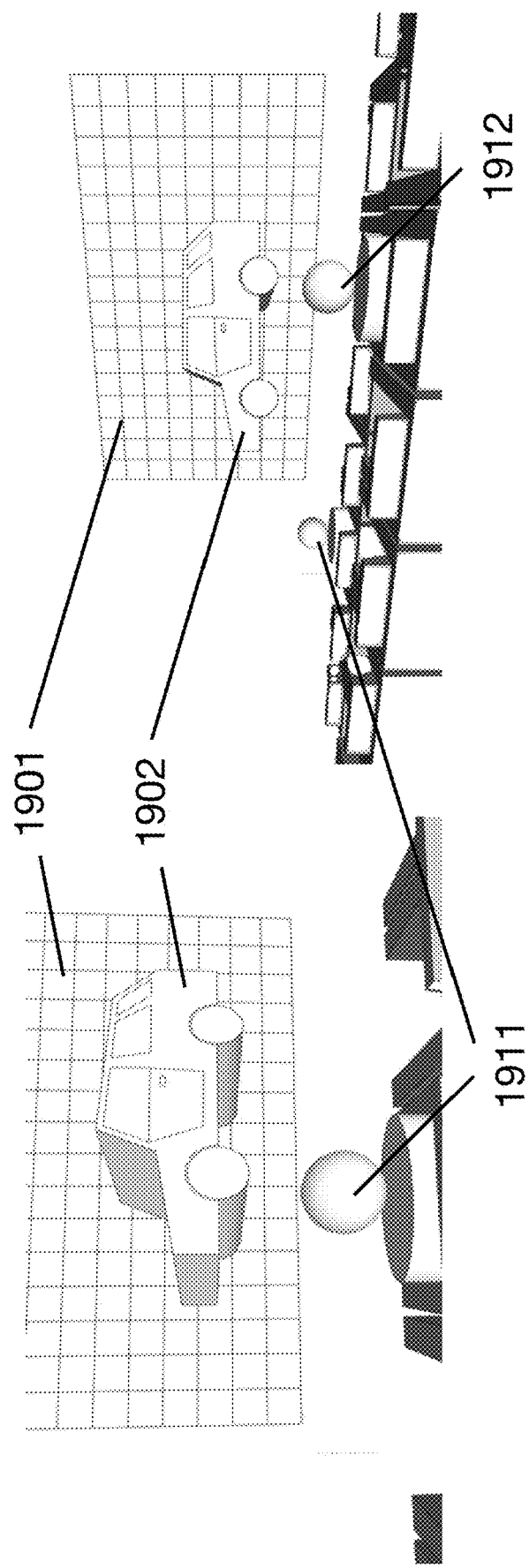
FIG. 22 shows an application of a light field display with a car in a third view.

FIGS. 20-22 show the application of light field display from different car views.

In FIG. 20, the viewer sees a three-dimensional representation of a car 1702 that is dependent on their point of view from the wall 1701. In FIG. 21, the viewer sees a three-dimensional representation of a car 1802 that is dependent on their point of view from the wall 1801. And in FIG. 22, viewers see a car 1902 on the screen 1901 from two different perspectives. One viewer 1911 is sitting closer and to the left and the other viewer is sitting further back and to the right 1912 so the image appears different to these two viewers as it would in any arbitrary location in the theater.

Figure 23:
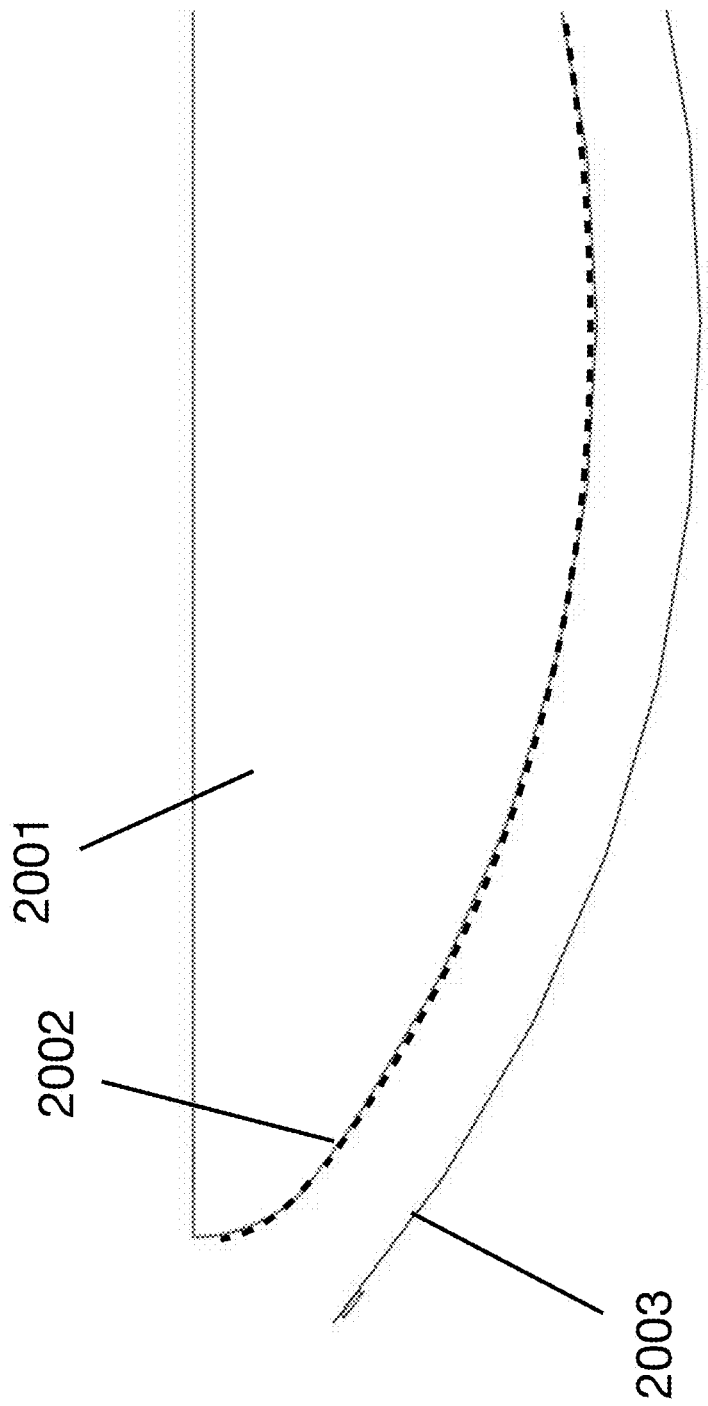
FIG. 23 shows an illustration of the application in the automotive industry.
Figure 25:
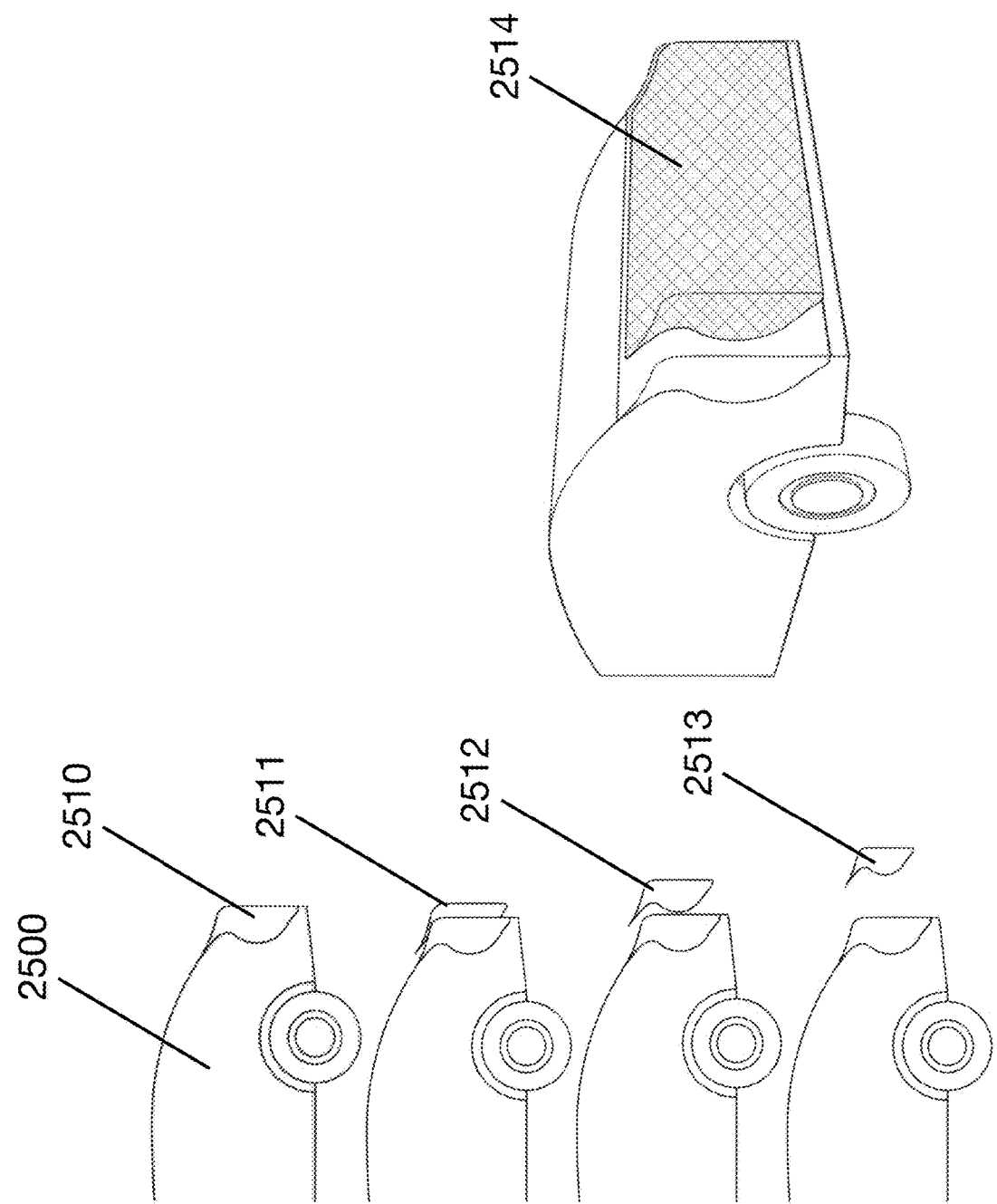
FIG. 25 shows an alternate illustration of a vehicle showing two points of view.

FIG. 23 shows one possible use for the components in cars where indicators can be seen to float off the surface of a car. Here the tail of a car 2001 is shown with the light field modules 2002 integrated in such a way that the output appears to float behind the car 2003.

As shown in FIG. 24, the tail on the car is shown with the indicator image generated by the light field components in two different positions 2101 and 2102.

And in an alternative view showing two points of view, a car 2500 is shown with a light field array 2510 on the rear of the vehicle. This array could appear to be floating off the back of the vehicle 2511 and could extend further behind the vehicle 2512, 2513 as the car reaches traveling speed. This can be used as a design element or as an indicator to other vehicles and pedestrians.

Figure 26:
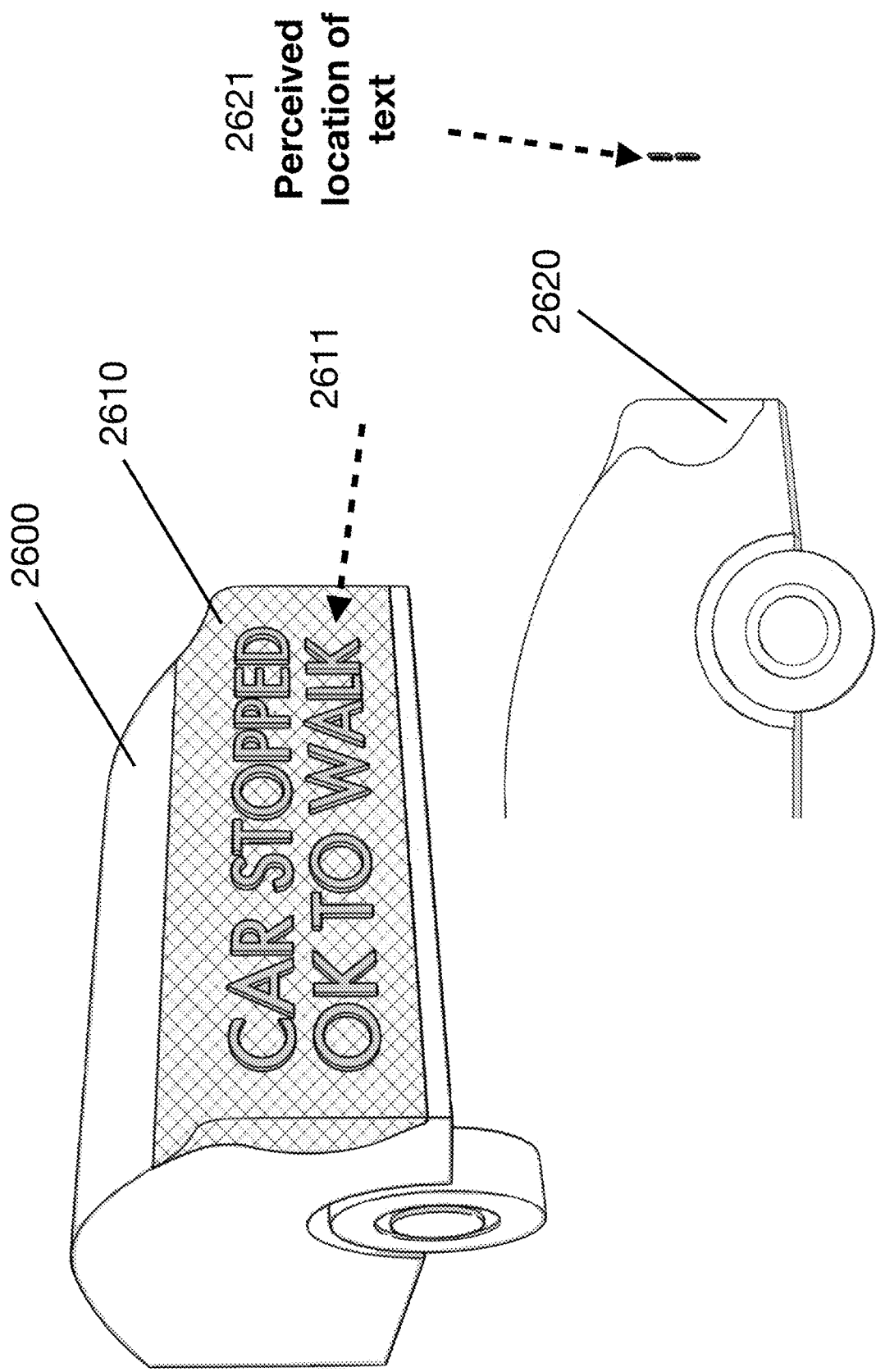
FIG. 26 shows notifications in an automotive application.

FIG. 26 shows notifications in an automotive context using the system herein. One way of delivering information from a car 2600 is text. A vehicle with a light field array 2610 on the rear of the car could display text 2611 so that a pedestrian would know that the autonomous driving system on the vehicle senses the presence of the pedestrian. A pedestrian might perceive the text 2621 as floating several feet behind the vehicle.

Figure 27:
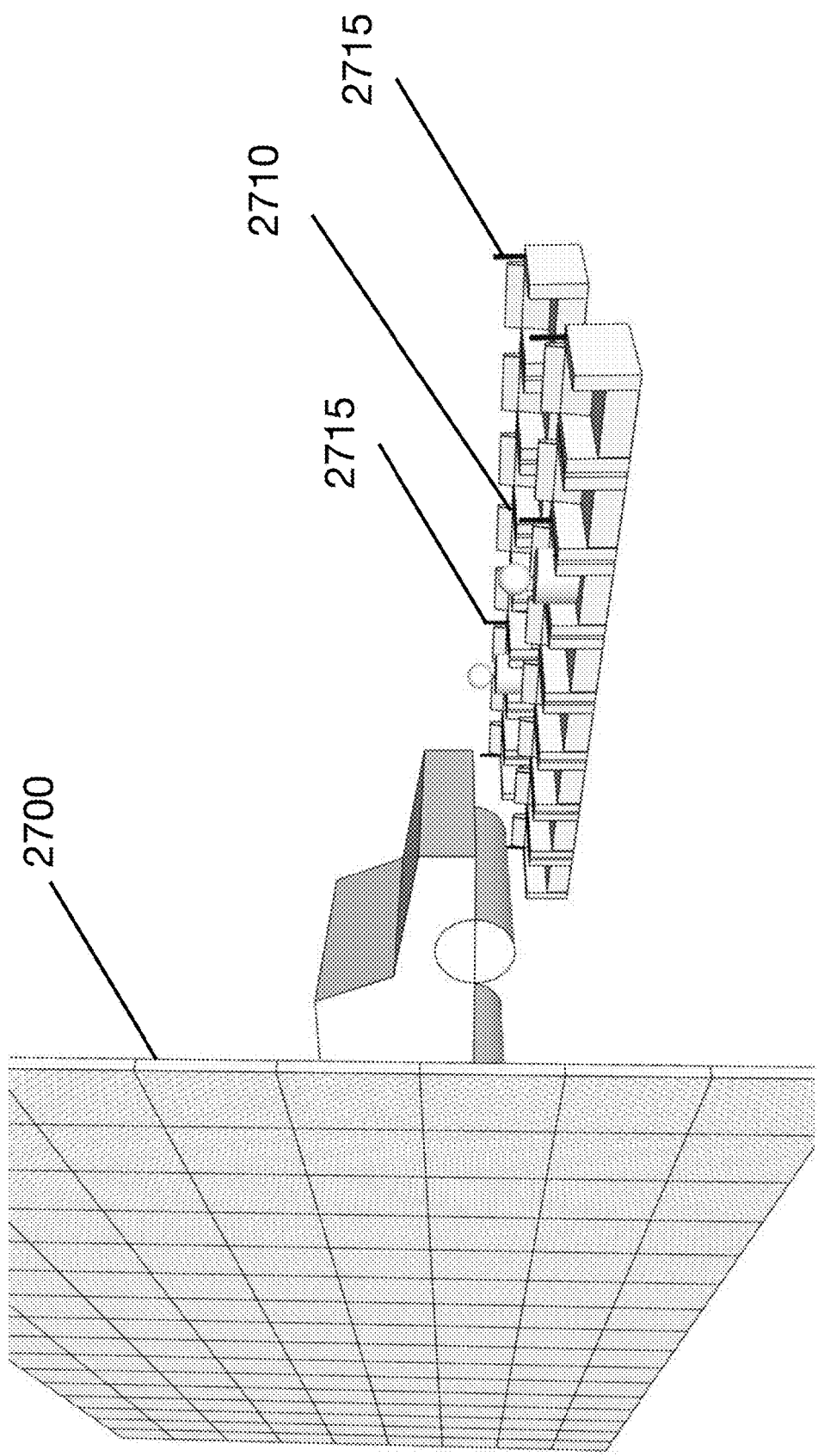
FIG. 27 shows a system calibration.
Figure 28:
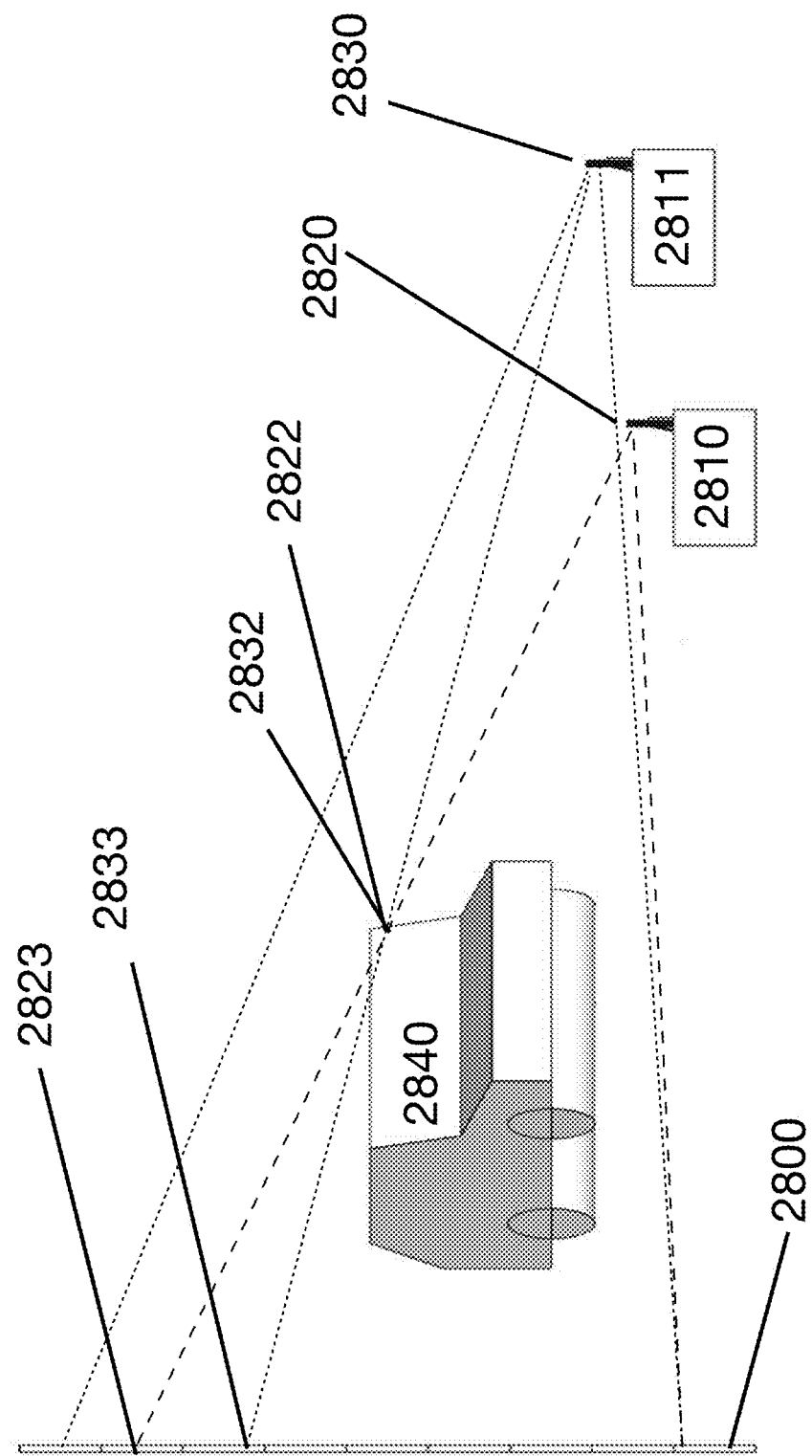
FIG. 28 shows calibration by seat.

FIGS. 27 and 28 show calibration techniques. As seen in FIG. 27, in addition to the internal calibration of the light field pixel, a system installed into a theater 2700 may also need to be calibrated so that the array aligns with the seating plan in the theater. This may be particularly important with theaters where the seating plan 2710 changes depending on the performance. In this case the seats could have sensors 2715 built in or added as needed in order to reference the display to the seating plan in the space.

As shown in FIG. 28, the calibration of the screen 2800 to the seats and the individuals in the seats 2810, 2811 may be critical. There are multiple possibilities to do this although a system including sensors in the seats 2820, 2830 is straight forward. In this system reference content 2840 is used to calibrate the system so that seat 2810 sees the correct part of the video 2822 as displayed by a pixel 2823. For seat 2811 the same point in the test content 2832 is displayed by pixel 2833. Sensor 2830 gathers this calibration data for seat 2811 and sends the data back to the processor where adjustments are made as needed. The processor contains a map of the space that merges the physical space and the digital test content into a single map. So adjustments made in this digital map immediately effect the rendering of the content. This becomes part of the installation processor for any system composed of light field pixels.

Application of the Technology

Theater—A light field could be used in both popular and artistic theatrical performances placing performers in realistic or abstract scenes enabling designers to mount plays where the physical sets may have been too challenging.

Film—in theory this could be a very effective virtual set because an actor would see everything as it will be in the rendered scene. And the fact that the actor and the camera or cameras could be getting different data means that you could simultaneously capture on green screen while capturing against a 2D virtual background while an actor sees the content they need to see for the scene. In order for this to work well the system may need to operate at the frequency of the cameras so the system must support 24 FPS playback.

Movie Theaters—Beyond the obvious benefit of enhancing the movie theater experience the system can be used to display subtitles to individuals so that two adjacent people may be seeing subtitles in different languages.

Live Entertainment—This could be a part of concert tours enhancing the already video heavy sets used now. A band that did an album in a famous national park could place themselves in the park while dynamically digitally relighting the environment.

Environments—A surface composed of light field pixels could sit behind a physical scenic element. When combined with supplemental lighting a localized physical space could be dropped in the middle of an island or a forest. The windows of a space could be composed of light field pixels given guests at a fondue restaurant in a basement in Cleveland the sense that they were looking out over the alps.

Automotive—As the surfaces of the cars are replaced by more functional materials and the experience of driving in autonomous vehicles becomes more common it will be necessary for the automated vehicles to effectively communicate with the world outside. Pedestrians will need to understand without being able to make eye contact with a driver. Dynamic light can replace that interaction by transforming the light field around a car. This also allows a car to adopt a design profile based on its function. A car used as a branded company transport during the day could become a glowing limousine at night.

Architecture—Hybrid mesh systems could integrate near field light generated by display along with projected light from spot and wash lights to create dynamic lines in buildings creating artificial illumination sources.

In all of these environments the light output could be controlled so that only necessary light field pixels are illuminated. This benefits each of these applications by reducing ambient light levels.

In an alternate embodiment, not shown, the OMP with white light field pixels may be used in an array to backlight an LCD.

While the invention has been described with reference to the embodiments above, a person of ordinary skill in the art would understand that various changes or modifications may be made thereto without departing from the scope of the claims.

The invention claimed is:

1. An optical multiplexing package comprising:
an optical lens;
an array of LEDs mounted on a movable stage, wherein the LEDs project light through the optical lens; and
a driver that controls movement of the stage such that the light passing through the lens changes with movement of the stage, wherein the stage moves parallel to the optical lens, and the stage movement also moves the array of LEDs;
wherein at least some of the LEDs from the array of LEDs emit different light waves, and wherein the optical lens bends the different light waves projected therethrough such that the different light waves exit the lens at multiple angles to achieve an optical multiplexing.

2. The optical multiplexing package of claim 1, wherein the stage is a linear comb based device.

3. The optical multiplexing package of claim 1, wherein the LEDs are microLEDs spaced from one another by under 60 microns.

4. The optical multiplexing package of claim 1, wherein the stage moves linearly along two axes.

5. The optical multiplexing package of claim 1, wherein the stage is rotatable about an axis.

6. The optical multiplexing package of claim 1, wherein the LED stage includes LED driver circuitry reducing the number of connections required from the driver to individual red, green, and blue LEDs.

7. The optical multiplexing package of claim 1, wherein combinations of the LEDs form pixels and adjacent pixels share LEDs of same colors.

8. The optical multiplexing package of claim 1, wherein the light is inverted between the LEDs and the optical lens.

9. The optical multiplexing package of claim 1, wherein the optical multiplexing package is used in a light field display.

10. The optical multiplexing package of claim 1, wherein a display includes multiple optical multiplexing packages.

11. The optical multiplexing package of claim 1, wherein movement of the stage creates multiple paths of light, wherein a viewer perceives different images in the multiple paths of light.

12. The optical multiplexing package of claim 11, wherein the different images appear as a single three-dimensional image to a viewer.

13. The optical multiplexing package of claim 1, wherein the array of LEDs is directly mounted on a CMOS MEMS device.

14. The optical multiplexing package of claim 1, comprising a calibration system comprising an LED in communication with a sensor and establishes a relative position of the stage to establish the LED array position.

15. The optical multiplexing package of claim 1, wherein movement of the stage moves the array of LEDs such that viewers at different of the multiple angles receive different light waves.

* * * * *